(12) United States Patent
Tsai et al.

(10) Patent No.: US 12,494,436 B2
(45) Date of Patent: Dec. 9, 2025

(54) INTEGRATED PASSIVE DEVICE DIES AND METHODS OF FORMING AND PLACEMENT OF THE SAME

(71) Applicant: Taiwan Semiconductor Manufacturing Company Limited, Hsinchu (TW)

(72) Inventors: Shang-Lun Tsai, Hsinchu (TW); Shuo-Mao Chen, New Taipei (TW); Po-Ying Lai, Hsinchu (TW); Monsen Liu, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 847 days.

(21) Appl. No.: 17/723,954

(22) Filed: Apr. 19, 2022

(65) Prior Publication Data

US 2022/0415813 A1 Dec. 29, 2022

Related U.S. Application Data

(60) Provisional application No. 63/213,934, filed on Jun. 23, 2021.

(51) Int. Cl.
*H01L 23/538* (2006.01)
*H01L 23/00* (2006.01)
*H01L 23/14* (2006.01)
*H01L 23/495* (2006.01)
*H10D 84/01* (2025.01)

(52) U.S. Cl.
CPC ........ *H01L 23/5386* (2013.01); *H01L 23/147* (2013.01); *H01L 23/49579* (2013.01); *H01L 24/16* (2013.01); *H01L 24/32* (2013.01); *H01L 24/73* (2013.01); *H10D 84/01* (2025.01); *H01L 2224/16012* (2013.01); *H01L 2224/32106* (2013.01); *H01L 2224/73204* (2013.01)

(58) Field of Classification Search
CPC ............... H01L 23/5386; H01L 23/147; H01L 23/49579

See application file for complete search history.

(56) References Cited

U.S. PATENT DOCUMENTS

2018/0197755 A1* 7/2018 Hsu ..................... H01L 23/5389

* cited by examiner

*Primary Examiner* — Errol V Fernandes
(74) *Attorney, Agent, or Firm* — The Marbury Law Group, PLLC

(57) ABSTRACT

A method of fabricating integrated passive device dies includes forming a first plurality of integrated passive devices on a substrate, forming a plurality of micro-bumps on the first plurality of integrated passive devices such that the plurality of micro-bumps act as electrical connections to the integrated passive devices, and dicing the substrate to form an integrated passive device die including a second plurality of integrated passive devices. The micro-bumps may be formed in an array or staggered configuration and may have a pitch that is in a range from 20 microns to 100 microns. The integrated passive devices may each include a seal ring and the integrated passive device die may have an area that is a multiple of an integrated passive device area. The method may further include dicing the substrate in various ways to generate integrated passive device dies having different sizes and numbers of integrated passive devices.

20 Claims, 14 Drawing Sheets

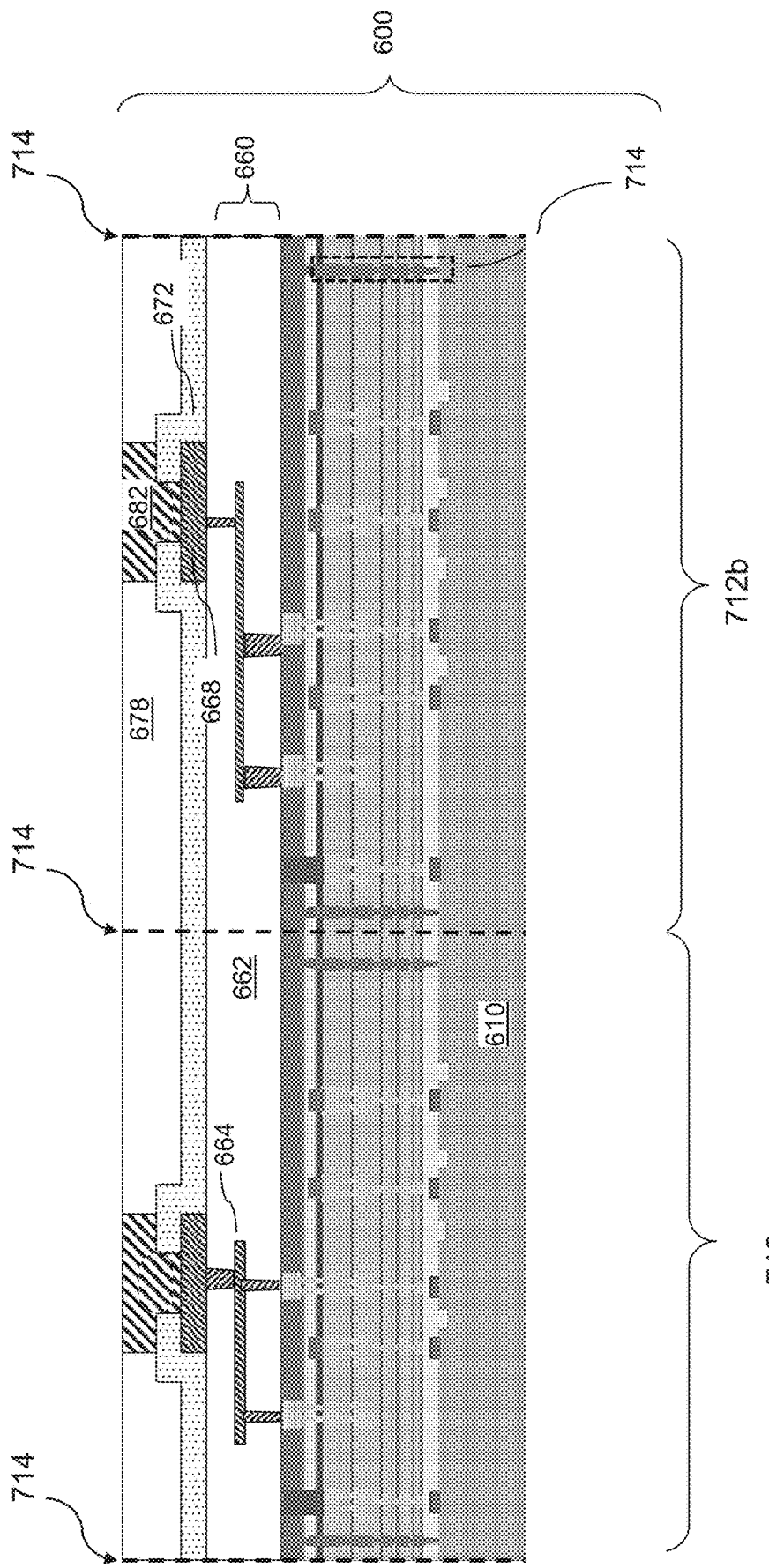

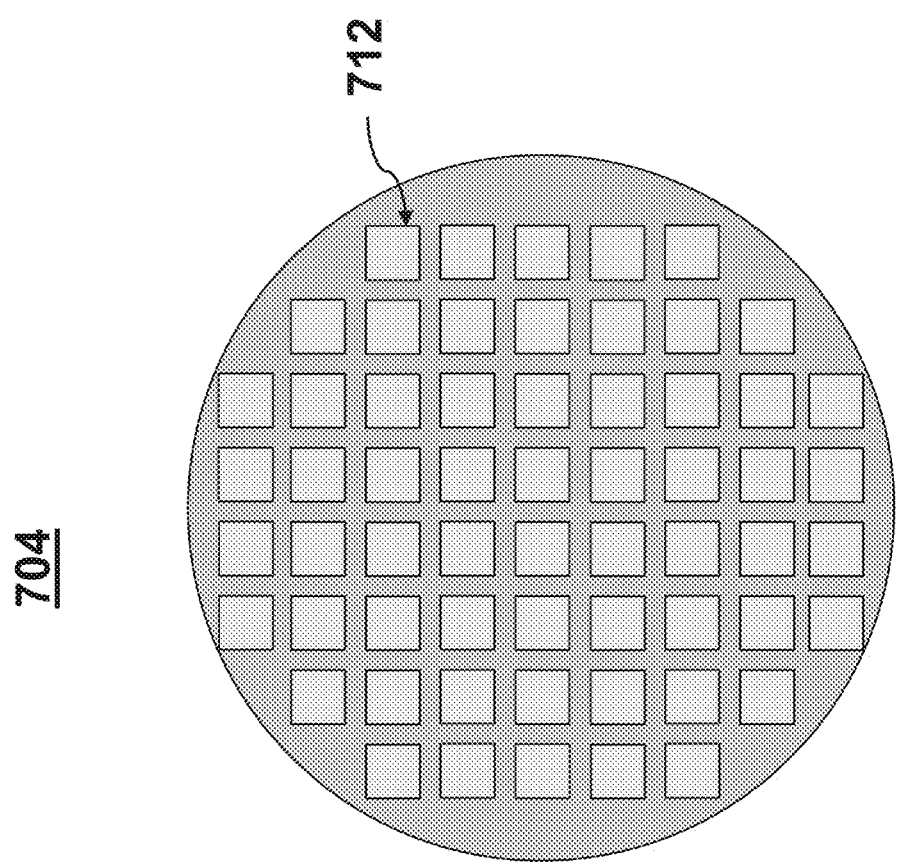

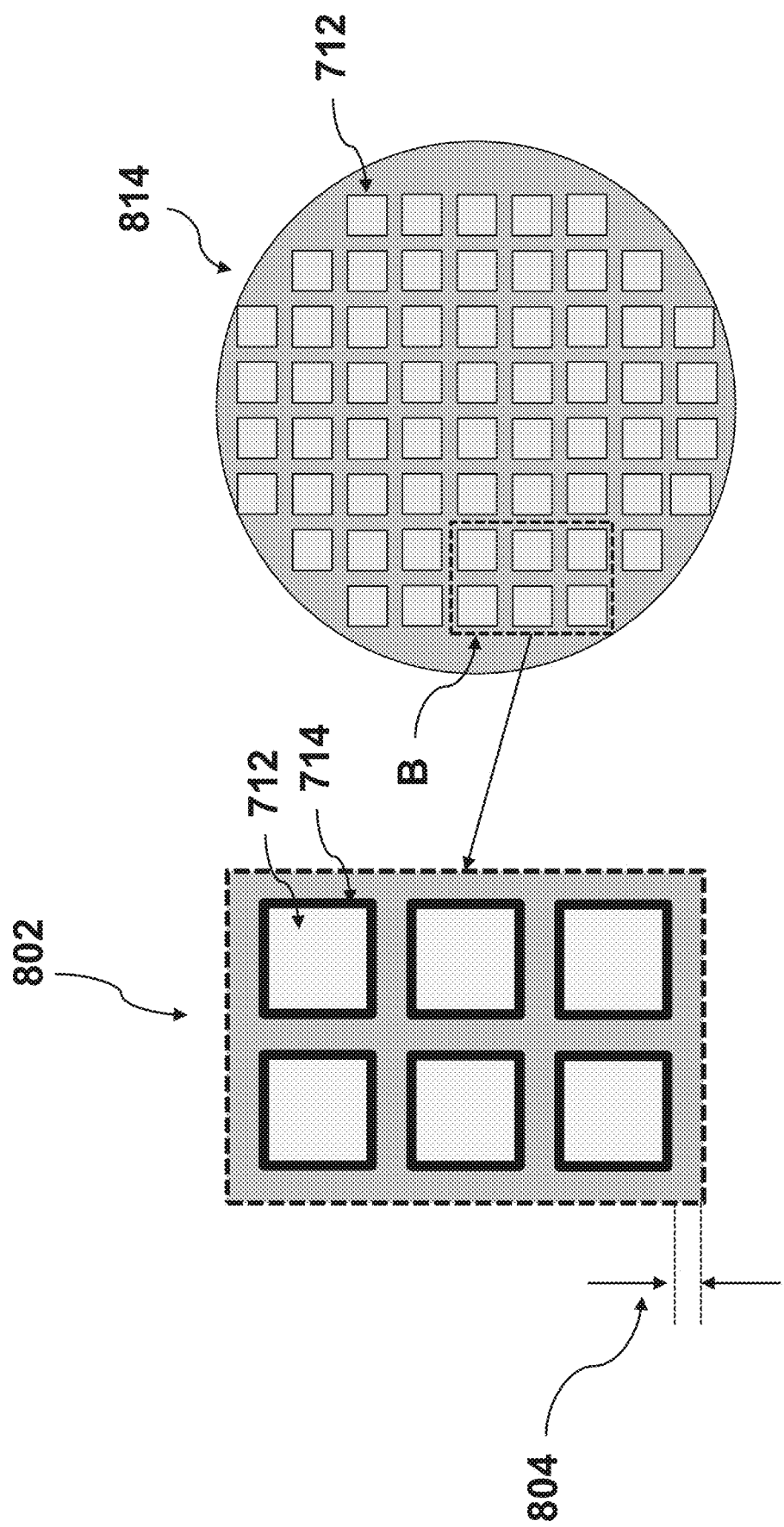

INTEGRATED PASSIVE DEVICE DIES AND METHODS OF FORMING AND PLACEMENT OF THE SAME

RELATED APPLICATIONS

This application claims priority to U.S. Provisional Patent Application No. 63/213,934 entitled "New method for integrated passive device placement in interposer" filed on Jun. 23, 2021, the entire contents of which are hereby incorporated by reference for all purposes.

BACKGROUND

The semiconductor industry has grown due to continuous improvements in integration density of various electronic components (e.g., transistors, diodes, resistors, capacitors, etc.). For the most part, these improvements in integration density have come from successive reductions in minimum feature size, which allows more components to be integrated into a given area.

In addition to smaller electronic components, improvements to the packaging of components have been developed in an effort to provide smaller packages that occupy less area than previous packages. Example approaches include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is a vertical cross sectional view of an integrated passive device, according various embodiments.

FIG. 7 is a plan view of a semiconductor wafer having a plurality of integrated passive devices formed thereon, according to various embodiments.

FIG. 8A is a plan view of a further semiconductor wafer having a plurality of integrated passive devices formed thereon, according to various embodiments.

FIG. 8B is a plan view of an integrated passive device die formed by dicing a portion of the semiconductor wafer of FIG. 8A, according to various embodiments.

DETAILED DESCRIPTION

Figure 1A:
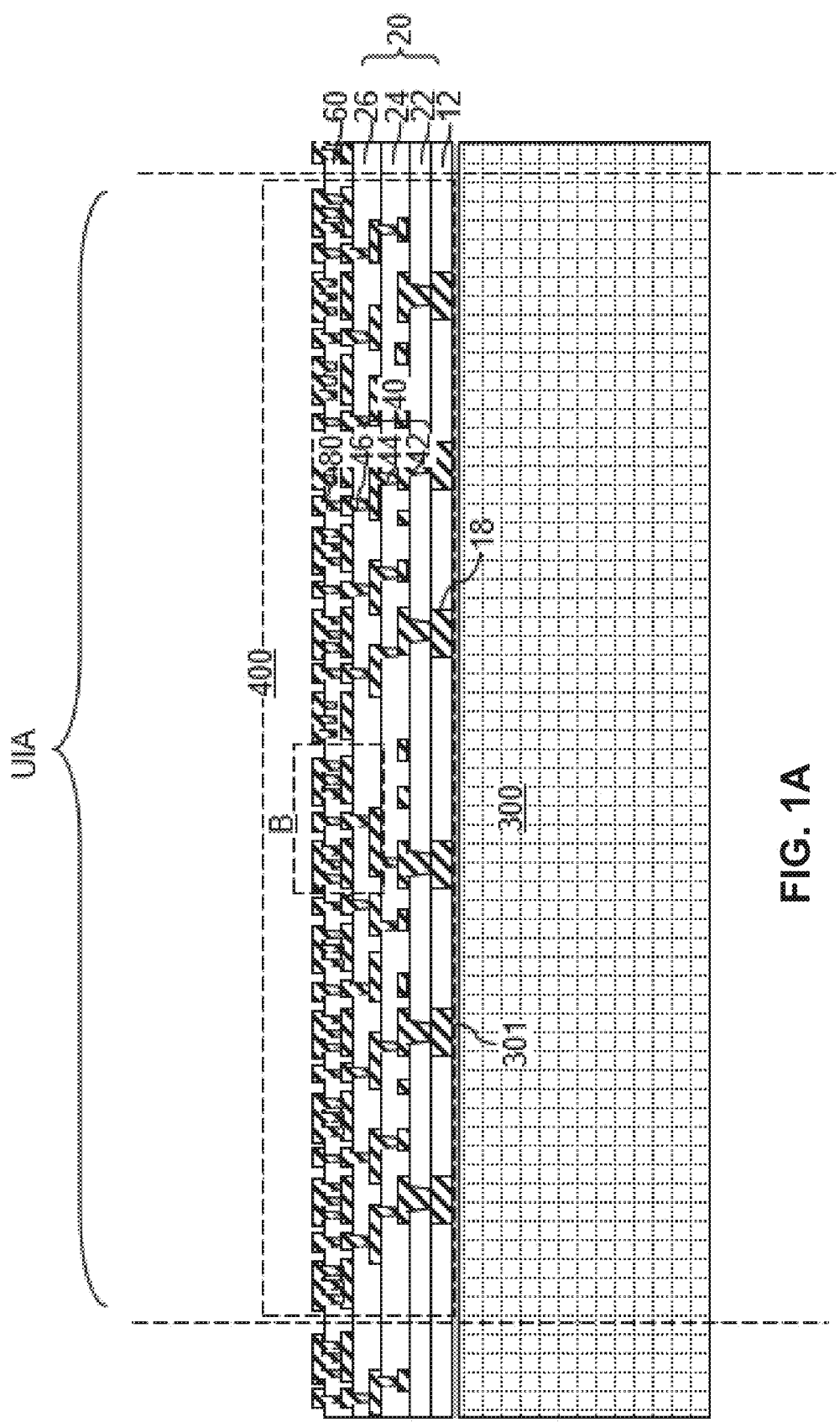
FIG. 1A is a vertical cross-sectional view of an exemplary structure including an organic interposer formed over a carrier substrate, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Generally, conventional integrated passive device (IPD) dies have fixed size and electrical properties. Thus, conventional circuit designs may be limited by existing integrated passive device dies. Various embodiments are disclosed herein that provide integrated passive device dies, and methods of forming the same, that have advantages over conventional integrated passive device dies. Various embodiments disclosed herein may provide for an integrated passive device dies that may be chosen to have a plurality of integrated passive devices. Further, the number of integrated passive devices may be chosen by the way in which the semiconductor wafer upon which the integrated passive devices are formed is diced. As such, a plurality of different types of integrated passive device dies, having different sizes and numbers of integrated passive devices, may be generated by dicing the semiconductor wafer upon which the integrated passive devices are formed. As such, in various embodiments, structures and methods disclosed herein may provide for greater flexibility in the design and fabrication of integrated passive device dies relative to conventional approaches.

Figure 1B:
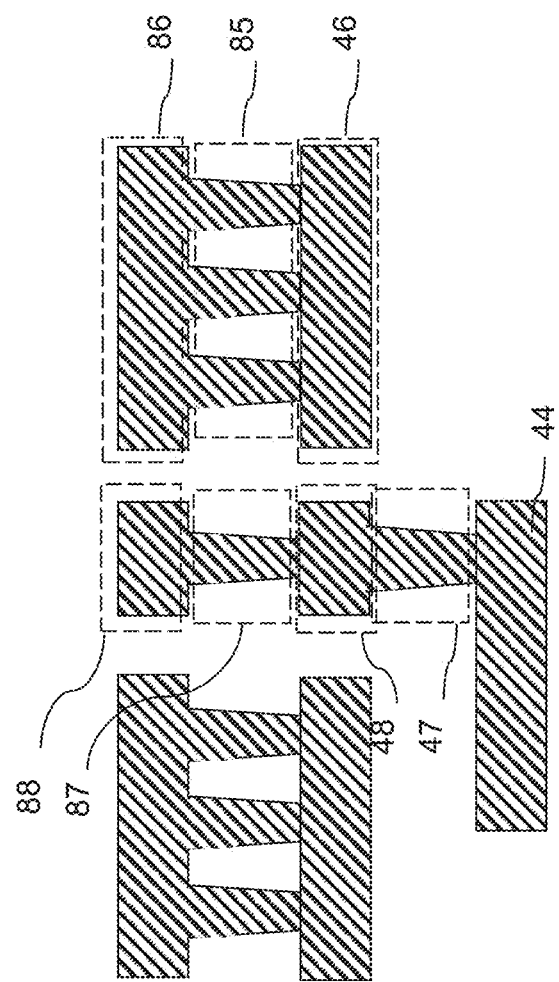
FIG. 1B is a magnified view of region B of FIG. 1A, according to various embodiments.

FIG. 1A is a vertical cross-sectional view of an exemplary structure including an organic interposer 400 formed over a carrier substrate 300, according to various embodiments. FIG. 1B is a magnified view of region B of FIG. 1A. The organic interposer 400 may be formed within a respective unit interposer area (UTA). A three-dimensional array of organic interposers 400 may be formed on the carrier substrate 300. The carrier substrate 300 may be a circular wafer or a rectangular wafer. The lateral dimensions (such as the diameter of a circular wafer or a side of a rectangular wafer) of the carrier substrate 300 may be in a range from approximately 100 mm to approximately 500 mm, such as from 200 mm to 400 mm. Further embodiments may include carrier substrates having larger or smaller lateral dimensions.

The carrier substrate 300 may include a semiconductor substrate, an insulating substrate, or a conductive substrate. The carrier substrate 300 may be transparent or opaque. The carrier substrate 300 may have a thickness that is sufficient to provide mechanical support to an array of organic interposers 400 to be subsequently formed thereupon. For example, the carrier substrate 300 may have a thickness in a range from approximately 60 microns to approximately 1 mm. Alternative embodiments may include carrier substrates having a larger or smaller thickness.

The exemplary structure of FIG. 1A may include an adhesive layer 301 applied to a top surface of the carrier substrate 300. In various embodiments, the carrier substrate 300 may include an optically transparent material such as glass or sapphire. In this example, the adhesive layer 301 may include a light-to-heat conversion (LTHC) layer. The LTHC layer may be a solvent-based coating applied using a spin coating method. The LTHC layer may form a layer that converts ultraviolet light to heat such that the LTHC layer loses adhesion. Alternatively, the adhesive layer 301 may include an adhesive material that is configured to thermally decomposed. For example, the adhesive layer 301 may include an acrylic pressure-sensitive adhesive that decomposes at an elevated temperature. The thermally decomposing adhesive material may have a debonding temperature that is in a range from approximately 150° F. to approximately 400° F. Other suitable thermally decomposing adhesive materials that decompose at other temperatures are within the contemplated scope of disclosure.

Package-side bonding structures 18 may be formed over the adhesive layer 301, and may be used to provide bonding to a package substrate, and thus, are herein referred to as package-side bonding structures 18. In one embodiment, the package-side bonding structures 18 may be arranged as a two-dimensional array, which may be a two-dimensional periodic array such as a rectangular periodic array. In one embodiment, the package-side bonding structures 18 may be formed as controlled collapse chip connection (C4) bump structures.

The package-side bonding structures 18 may include any metallic material that may be bonded to a solder material. For example, an underbump metallurgy (UBM) layer stack may be deposited over the adhesive layer 301. The order of material layers within the UBM layer stack may be selected such that solder material portions may be subsequently bonded to portions of the bottom surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure. The thickness of the UBM layer stack may be in a range from approximately 5 microns to approximately 60 microns, such as from 10 microns to 30 microns. Alternative embodiments may include a UBM layer stack having smaller or larger thicknesses.

A polymer matrix layer, which is herein referred to as a proximal polymer matrix layer 12, may be deposited over the package-side bonding structure 18. The proximal polymer matrix layer 12 may include a dielectric polymer material such as polyimide (PI), benzocyclobutene (BCB), or polybenzobisoxazole (PBO). Other suitable dielectric materials are within the contemplated scope of disclosure. The thickness of the proximal polymer matrix layer 12 may be in a range from approximately 4 microns to approximately 60 microns. Alternative embodiments may include proximal polymer matrix layer 12 having larger or smaller thicknesses.

Redistribution interconnect structures 40 and additional polymer matrix layers may be formed over the package-side bonding structures 18 and the proximal polymer matrix layer 12. The additional polymer matrix layers are herein referred to collectively as interconnect-level polymer matrix layers 20. The interconnect-level polymer matrix layers 20 may include a plurality of polymer matrix layers (22, 24, 26) such as a first polymer matrix layer 22, a second polymer matrix layer 24, and a third polymer matrix layer 26. While the present disclosure is described using an embodiment in which three polymer matrix layers (22, 24, 26) embed redistribution interconnect structures 40, embodiments are expressly contemplated herein in which the interconnect-level polymer matrix layers 20 include two, four, or five or more polymer matrix layers.

The redistribution interconnect structures 40 may include multiple levels of redistribution interconnect structures 40 that are formed through a respective one of the polymer matrix layers (22, 24, 26). The redistribution interconnect structures 40 may include metal via structures, metal line structures, and/or integrated line and via structures. Each integrated line and via structure includes a unitary structure containing a metal line structure and at least one metal via structure. A unitary structure refers to a single continuous structure in which each point within the structure may be connected by a continuous line (which may or may not be straight) that extends only within the structure.

In an example embodiment, the redistribution interconnect structures 40 may include first redistribution interconnect structures 42 that are formed through, and/or on a top surface of, the first polymer matrix layer 22; second redistribution interconnect structures 44 that are formed through, and/or on a top surface of, the second polymer matrix layer 24; and third redistribution interconnect structures (46 in FIG. 1A or 48, 47 in FIG. 1B) that are formed through, and/or on a top surface of, the third polymer matrix layer 26.

While an embodiment of the present disclosure includes the redistribution interconnect structures 40 embedded within three polymer matrix layers (22, 24, 26), embodiments are expressly contemplated herein in which the redistribution interconnect structures 40 are embedded within one, two, or four or more polymer matrix layers.

Each of the interconnect-level polymer matrix layers 20 may include a dielectric polymer material such as polyimide (PI), benzocyclobutene (BCB), or polybenzobisoxazole (PBO). Other suitable materials are within the contemplated scope of disclosure. The thickness of each interconnect-level polymer matrix layer 20 may be in a range from approximately 4 microns to approximately 20 microns, although alternative embodiments may include smaller or larger thicknesses.

The redistribution interconnect structures 40 may include at least one metallic material such as Cu, Mo, Co, Ru, W, TiN, TaN, WN, or a combination or a stack thereof. Other suitable materials are within the contemplated scope of this disclosure. For example, each of the redistribution interconnect structures 40 may include a layer stack of a TiN layer and a Cu layer. In embodiments in which a redistribution interconnect structure 40 includes a metal line structure, a thickness of the metal line structure may be in a range from approximately 2 microns to approximately 20 microns, although alternative embodiments may include smaller or larger thicknesses.

The redistribution interconnect structures 40 located at a topmost metal interconnect level (such as the third redistribution interconnect structures (see e.g., FIG. 1B, reference numbers 48, 47)) may include metallic pad structures 48. In one embodiment, the metallic pad structures 48 may be formed as a two-dimensional array. In one embodiment, the metallic pad structures 48 may be formed as a pad portion of a respective unitary structure including a metallic pad structure 48 and a metallic via structure 47. For example, the metallic pad structures 48 may be located on a top surface of the third polymer matrix layer 26, and the metallic via structures 47 may vertically extend through the third polymer matrix layer 26 (e.g., see FIG. 1A).

Each metallic via structure 47 (e.g., see FIG. 1B) connected to an overlying metallic pad structure 48 may contact a top surface of a respective underlying redistribution interconnect structure, which may be one of the second redistribution interconnect structure 44. In one embodiment (e.g., see FIG. 1B), a second redistribution interconnect structure 44 contacting a bottom surface of a metallic via structure 47 may have an enlarged end portion to ensure that the metallic via structure 47 lands on a top surface of the second redistribution interconnect structure 44 despite overlay variations that may occur during patterning of the metallic via structure 47. In one embodiment, an outer periphery of the second redistribution interconnect structure 44 contacting a metallic via structure 47 may be laterally offset outward from a periphery of the bottom surface of the metallic via structure by a lateral distance that is greater than the maximum overlay tolerance of the lithographic process that is used to pattern the shape for the metallic via structure 47.

An additional polymer matrix layer may be deposited over the metallic pad structures 48 and the at least one metallic base plate 46 of each organic interposer 400. The additional polymer matrix layer is herein referred to as a distal polymer matrix layer 60 (shown in FIG. 1A). The distal polymer matrix layer 60 may include a dielectric polymer material such as polyimide (PI), benzocyclobutene (BCB), or polybenzobisoxazole (PBO). Other suitable materials are within the contemplated scope of disclosure. A thickness of the distal polymer matrix layer 60 may be in a range from approximately 4 microns to approximately 60 microns, such as from 8 microns to 30 microns, although alternative embodiments may include smaller or larger thicknesses. The proximal polymer matrix layer 12, the interconnect-level polymer matrix layer 20, and the distal polymer matrix layer 60 are collectively referred to as polymer matrix layers (12, 20, 60).

With reference to FIG. 1B, die-side bonding structures (88, 87) and the at least one metallic support structure (86, 85) are collectively referred to as bonding-level metallic structures 80 (e.g., see FIG. 1A). The bonding-level metallic structures 80 may include any metallic material that may be bonded to a solder material. For example, the at least one metallic material may include a UBM layer stack. The order of material layers within the UBM layer stack is selected such that solder material portions may be subsequently bonded to portions of the top surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of this disclosure. The thickness of the UBM layer stack may be in a range from approximately 5 microns to approximate 60 microns, such as from 10 microns to 30 microns, although alternative embodiments may include smaller or larger thicknesses.

The die-side bonding structures (88, 87) may be formed directly on, and over, the metallic pad structures 48, and each metallic support structure (86, 85) may be formed directly on, and over, a respective metallic base plate 46. In one embodiment, each of the die-side bonding structures (88, 87) and the at least one metallic support structure (86, 85) may be formed as a respective unitary structure (i.e., a respective continuous structure). In an embodiment, each of the die-side bonding structures (88, 87) includes a respective first unitary structure containing a die-side bonding structure 88 and a bump connection via structure 87 that may be electrically connected to a respective one of the redistribution interconnect structures 40.

Each die-side bonding structure 88 may be a patterned portion of a UBM layer stack that remains over a horizontal plane including the top surface of the distal polymer matrix layer 60, and each bump connection via structure 87 may be a patterned portion of the UBM layer stack that remains below the horizontal plane including the top surface of the distal polymer matrix layer 60. In one embodiment, each combination within the die-side bonding structures 88 and the bump connection via structures 87 includes a respective first unitary structure in which a first conductive material portion continuously extends across a respective die-side bonding structure 88 and a respective bump connection via structure 87.

In one embodiment, each of the metallic support structures (86, 85) includes a respective second unitary structure containing a metallic shield structure 86 and at least one shield support via structure 85 contacting a respective metallic base plate 46. Each metallic shield structure 86 may be a patterned portion of a UBM layer stack that remains over a horizontal plane including the top surface of the distal polymer matrix layer 60, and each shield support via structure 85 may be a patterned portion of the UBM layer stack that remains below the horizontal plane including the top surface of the distal polymer matrix layer 60.

In one embodiment, each combination within the at least one metallic shield structure 86 and the shield support via structures 85 includes a respective second unitary structure in which a second conductive material portion continuously extends across a respective metallic shield structure 86 and a respective plurality of shield support via structures 85. Each shield support via structure 85 provides mechanical support to a respective metallic shield structure 86 when pressure is applied to the metallic shield structure 86 (such as application of an underfill material in a subsequent processing step).

Each of the at least one metallic support structure (86, 85) laterally surrounds at least one of the die-side bonding structures (88, 87). The bump connection via structures 87 and the shield support via structures 85 may be formed through the distal polymer matrix layer 60. Each metallic support structure (86, 85) surrounds a respective one of the die-side bonding structures (88, 87). Each metallic shield structure 86 is located at a same level as the die-side bonding structures 88, and the shield support via structures 85 are located at a same level as the bump connection via structures 87.

The package-side bonding structures 18 (e.g., see FIG. 1A) may be located on a first side of the polymer matrix layers (12, 20, 60) and may be connected to, and may be in contact with, a proximal subset of the redistribution interconnect structures 40. The die-side bonding structures (88, 87) may be located on a second side of the polymer matrix layers (12, 20, 60), and may be connected to, and contact, a distal subset of the redistribution interconnect structures 40. In one embodiment, the die-side bonding structures 88 may be located on the second side of the polymer matrix layers (12, 20, 60), and may be connected to a distal subset of the redistribution interconnect structures 40 through a respective bump connection via structure 87.

Each opening in a metallic shield structure 86 may be circular, elliptical, polygonal, or of any planar two-dimensional closed shape. Each die-side bonding structure 88 may have the same thickness as, and the same material composition as, the at least one metallic shield structure 86. Each die-side bonding structure 88 and the at least one metallic shield structure 86 may include a respective UBM layer stack having a same layer composition. Each layer within the UBM layer stacks of the die-side bonding structures 88 may have the same thickness as, and the same material composition as, a corresponding layer within the at least one metallic shield structure 86.

The shield support via structures 85 may be located at the same level as the bump connection via structures 87, and may laterally surround a respective one of the bump connection via structures 87. Each of at least one metallic base plate 46 contacts bottom surfaces of a respective plurality of shield support via structures 85 selected from the shield support via structures 85. The die-side bonding structures 88 and the metallic shield structures 86 overlies, and contacts, a top surface of the distal polymer matrix layer 60, which is the topmost one of the polymer matrix layers (12, 20, 60).

Each metallic base plate 46 contacts bottom surfaces of at least one shield support via structure 85, and may contact bottom surfaces of a respective plurality of shield support via structures 85. In one embodiment, a metallic base plate 46 may contact bottom surfaces of a two-dimensional array of shield support via structures 85 that laterally surrounds a respective one of the bump connection via structures 87. The distal polymer matrix layer 60, which is the topmost one of the polymer matrix layers (12, 20, 60), laterally surrounds, and embeds, the bump connection via structures 87 and the shield support via structures 85.

In one embodiment, a metallic pad structure 48 may contact a bottom surface of a respective die-side bonding structures (88, 87) and may be connected to an underlying metallic via structure 47. The metallic pad structure 48 and the underlying metallic via structure 47 may be formed as an integrated structure. The underlying metallic via structure 47 may contact a top surface of an underlying metallic line structure, which may be a portion of a second redistribution interconnect structure 44, or a second redistribution interconnect structure 44.

Figure 2:
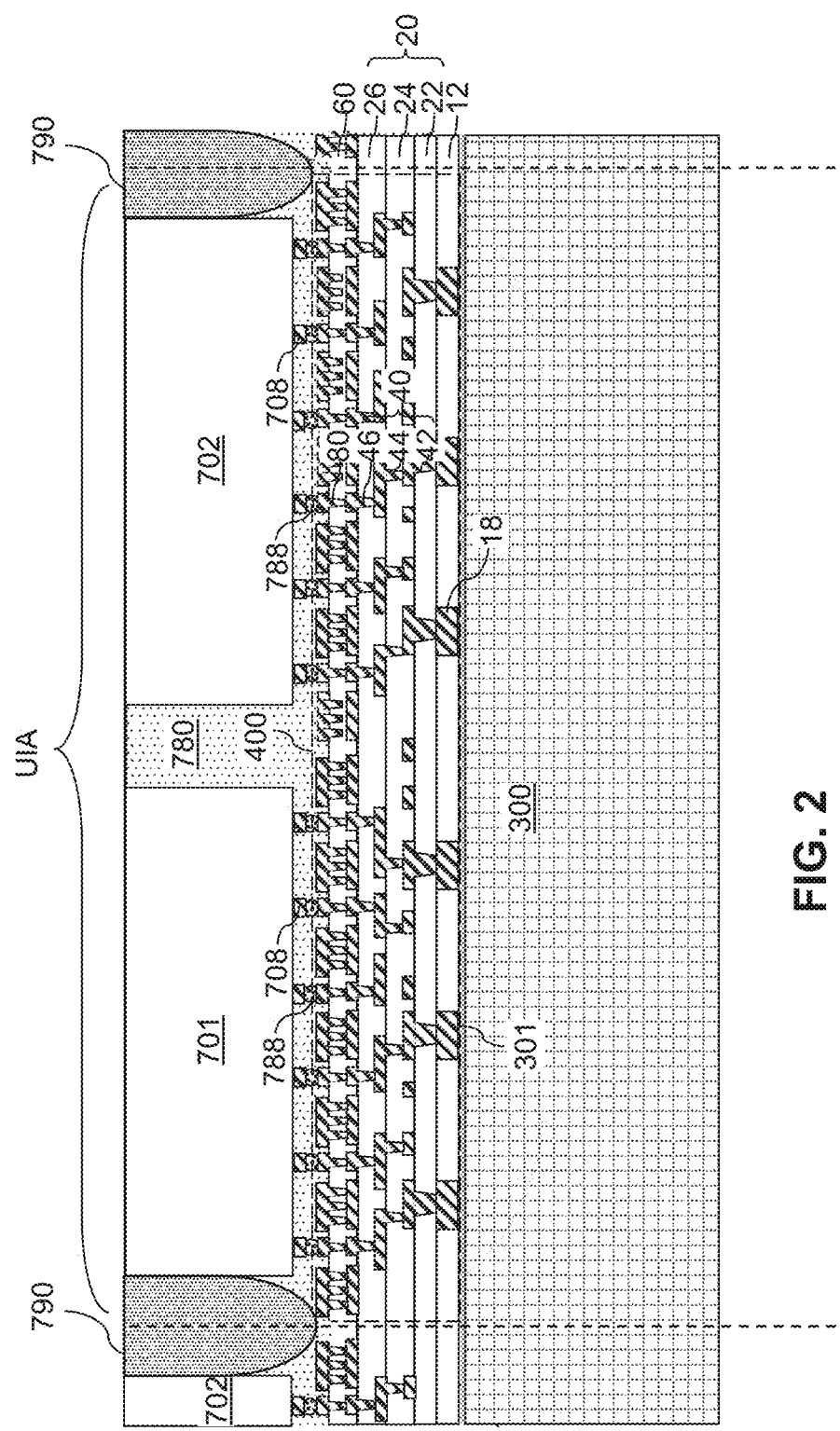
FIG. 2 is a vertical cross-sectional view of the exemplary structure including a fan-out wafer-level package, according to various embodiments.

FIG. 2 is a vertical cross-sectional view of the exemplary structure of FIGS. 1A and 1B after formation of a fan-out wafer-level package (FOWLP) according to various embodiments. In this example, at least one semiconductor die (701, 702) may be attached to the organic interposer 400. Each semiconductor die (701, 702) may be bonded to a respective subset of the die-side bonding structures 88 within a respective unit interposer area UTA through solder material portions 788. Each semiconductor die (701, 702) may include die bump structures 708. In one embodiment, the die bump structures 708 may include a two-dimensional array of micro-bump structures, and each semiconductor die (701, 702) may be attached to the die-side bonding structure 88 by C2 bonding (i.e., solder bonding between a pair of micro-bumps). A C2 bonding process that reflows the solder material portions 788 may be performed after the die bump structures 708 of the semiconductor dies (701, 702) are disposed over the array of solder material portions 788.

The at least one semiconductor die (701, 702) may include various types of semiconductor die. In one embodiment, for example, the semiconductor die (701, 702) may include a system-on-chip (SoC) die such as an application processor die. In another embodiment, the semiconductor die (701, 702) may include a plurality of semiconductor dies (701, 702). In one embodiment, the plurality of semiconductor dies (701, 702) may include a first semiconductor die 701 and at least one second semiconductor die 702. In one embodiment, the first semiconductor die 701 may be a central processing unit die, and the at least one second semiconductor die 702 may include a graphic processing unit die. In another embodiment, the first semiconductor die 701 may include a system-on-chip (SoC) die, and the at least one second semiconductor die 702 may include at least one high bandwidth memory (HBM) die, each of which includes a vertical stack of static random access memory dies and provides high bandwidth as defined under JEDEC standards (i.e., standards defined by The JEDEC Solid State Technology Association).

The semiconductor dies (701, 702) may be attached to the organic interposer 400 and may be positioned within a same horizontal plane. The least one semiconductor die (701, 702) may be attached to the die-side bonding structures 88 (e.g., see FIG. 1B) through at least one array of solder material portions 788. At least one underfill material portion 780 may be formed around each bonded array of solder material portions 788. Each underfill material portion 780 may be formed by injecting an underfill material around the array of solder material portions 788 after the solder material portions 788 are reflowed. Various underfill material application methods may be used, which may include, for example, a capillary underfill method, a molded underfill method, or a printed underfill method. In one embodiment, a plurality of semiconductor dies (701, 702) may be attached to an organic interposer 400 within each unit interposer area UTA, and a single underfill material portion 780 may continuously extend underneath the plurality of semiconductor dies (701, 702).

The metallic support structures (86, 85) and the metallic base plates 46 (e.g., see FIG. 1B) may be configured to provide mechanical support to underlying structures within each organic interposer 400 during application and curing of the underfill material. For example, the underfill application process may apply pressure to the distal polymer matrix layer 60 (e.g., see FIGS. 1A and 2). The combination of the metallic support structures (86, 85) and the metallic base plates 46 may provide mechanical support to prevent, or reduce, distortion of the distal polymer matrix layer 60 during the underfill application process, and may act to maintain the structural integrity of the organic interposers.

An epoxy molding compound (EMC) may be applied to gaps formed between the organic interposers 400 and the semiconductor dies (701, 702). The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC may provide better handling, good flowability, fewer voids, better fill, and fewer flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 301. For example, the curing temperature of the EMC may be in a range from 125° C. to 150° C.

The EMC may be cured at a curing temperature to form an EMC matrix that laterally encloses each of the semiconductor dies (701, 702). The EMC matrix may include a plurality of epoxy molding compound (EMC) frames 790 that are laterally adjoined to one another. Each EMC die frame 790 is located within a respective unit interposer area UTA, and laterally surrounds and embeds a respective set of at least one semiconductor die (701, 702), which may be a plurality of semiconductor dies (701, 702). Excess portions of the EMC may be removed from above the horizontal plane including the top surfaces of the semiconductor dies (701, 702) by a planarization process, which may use chemical mechanical planarization.

The exemplary structure of FIG. 2 may then be diced as shown by the dashed lines in FIG. 2 to form a FOWLP, which includes at least one semiconductor die (701, 702) (which may be a plurality of semiconductor dies), an organic interposer 400, an underfill material portion 780, and an EMC die frame 790. The EMC die frame 790 and the organic interposer 400 may have vertically coincident sidewalls, i.e., sidewalls located within a same vertical plane. In embodiments in which the FOWLP includes a plurality of semiconductor dies (701, 702), the underfill material portion 780 may contact sidewalls of the plurality of semiconductor dies (701, 702). The EMC die frame 790 continuously extends around, and laterally encircles, the at least one semiconductor die (701, 702) within the FOWLP.

The carrier substrate 300 may be detached from the assembly of the organic interposers 400, the semiconductor dies (701, 702), and the EMC die frames 790. The adhesive layer 301 may be deactivated, for example, by a thermal anneal at an elevated temperature. Embodiments may include an adhesive layer 301 that includes a thermally-deactivated adhesive material. In other embodiments in which the carrier substrate 300 may be transparent, an adhesive layer 301 may include an ultraviolet-deactivated adhesive material. The FOWLP may then be attached to a package substrate in further embodiments. In some embodiments, integrated passive devices may be connected to the bonding-level metallic structures 80 before the underfill material portion 780 and EMC die frame 790 are formed on the interposer, or integrated passive devices may be embedded in the interposer 400, as described in one of the following embodiments.

Figure 3:
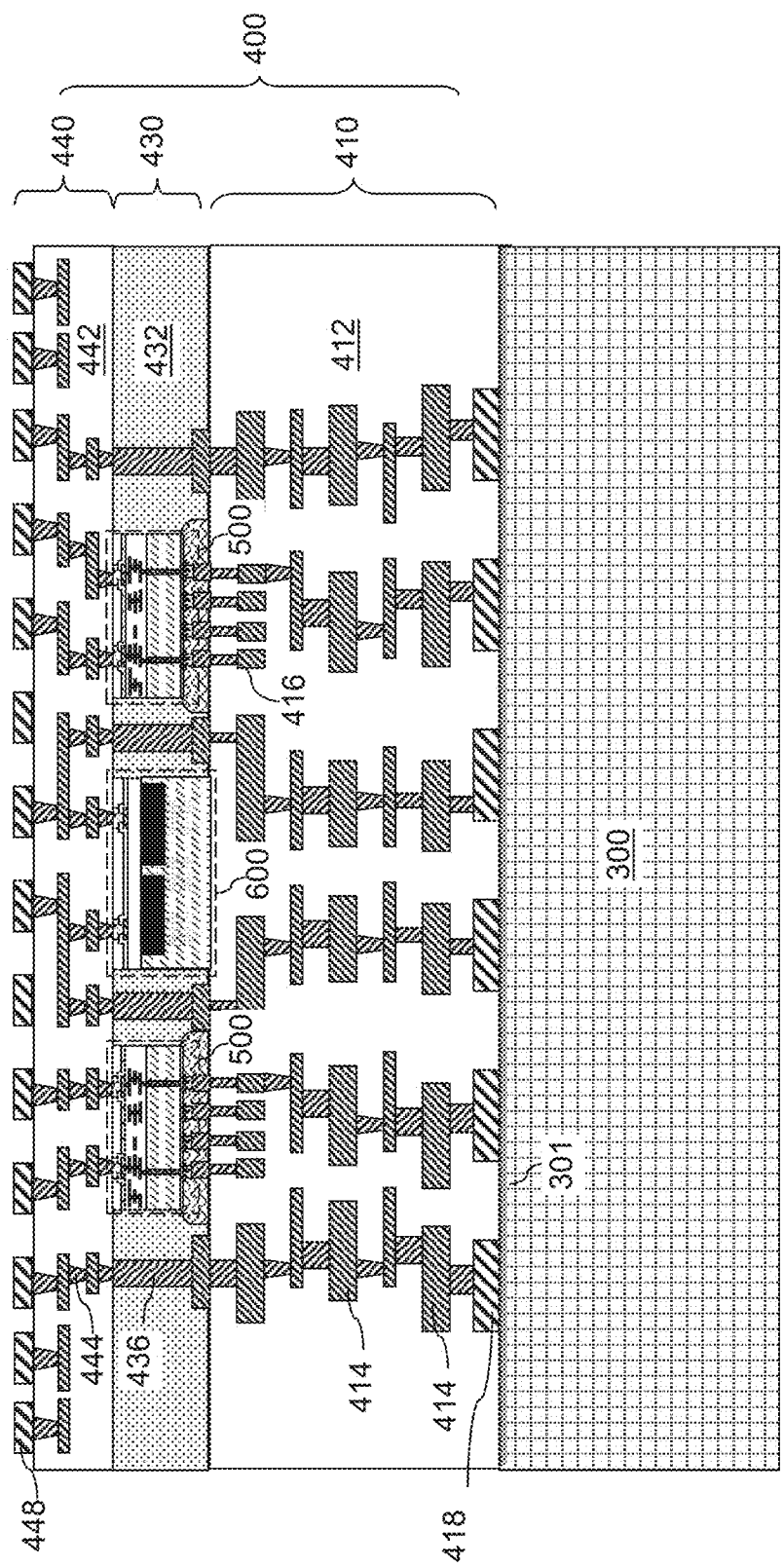
FIG. 3 is vertical cross-sectional view of an exemplary structure including a silicon interposer formed over a carrier substrate, according to various embodiments.

FIG. 3 is vertical cross-sectional view of an exemplary structure including a silicon interposer 400 formed over a carrier substrate 300, according to various embodiments. The silicon interposer 400 includes a package-side redistribution structure 410, an interposer core assembly 430, and a die-side redistribution structure 440 located within a die area. The interposer core assembly 430 includes at least one silicon substrate interposer 500 (described below with reference to FIG. 5), an epoxy molding compound (EMC) interposer frame 432 embedding the at least one silicon substrate interposer 500, and optionally through-molding-compound via (TMCV) structures 436 that vertically extend through the EMC interposer frame 432.

At least one integrated passive device 600, if present, may be embedded in the EMC interposer frame 432. As described in greater detail below with reference to FIGS. 6A and 6B, the integrated passive device 600 may include at least a first die 712a and a second die 712b. The at least one integrated passive device 600 may be electrically connected to die-side redistribution wiring interconnects 444 within the die-side redistribution structure 440, or to package-side redistribution wiring interconnects 414 within the package-side redistribution structure 410. The package-side redistribution wiring interconnects 414 may be formed within the package-side redistribution dielectric layers 412. In one embodiment, the electrical connections among the at least one silicon substrate interposer 500, the optional integrated passive devices 600, and the die-side redistribution wiring interconnects 444 can be tested using die-side bonding pads 448.

The die-side redistribution structures 440 may be formed over the interposer core assembly 430. The die-side redistribution structures 440 are a subset of redistribution structures that are formed on the side of the structure to which semiconductor dies may be subsequently attached with respective to the interposer core assembly 430. For example, a die-side redistribution structure 440 may be formed within each die area over the two-dimensional array of interposer core assemblies 430 (of which only one is illustrated in FIG. 3). Each die-side redistribution structure 440 may include die-side redistribution dielectric layers 442, die-side redistribution wiring interconnects 444, and die-side bonding pads 448.

The die-side redistribution dielectric layers 442 may include a respective dielectric polymer material such as polyimide (PI), benzocyclobutene (BCB), or polybenzobisoxazole (PBO). Each die-side redistribution dielectric layer 442 may be formed by spin coating and drying of the respective dielectric polymer material. The thickness of each die-side redistribution dielectric layer 442 may be in a range from approximately 2 microns to approximately 40 microns, such as from 4 microns to 20 microns. Each die-side redistribution dielectric layer 442 may be patterned, for example, by applying and patterning a respective photoresist layer thereabove, and by transferring the pattern in the photoresist layer into the die-side redistribution dielectric layer 442 using an etch process such as an anisotropic etch process. The photoresist layer may be subsequently removed, for example, by ashing.

Each of the die-side redistribution wiring interconnects 444 and the die-side bonding pads 448 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 150 nm, and the copper seed layer may have a thickness in a range from 100 nm to 500 nm. The metallic fill material for the die-side redistribution wiring interconnects 444 may include copper, nickel, or copper and nickel.

The thickness of the metallic fill material that is deposited for each die-side redistribution wiring interconnect 444 may be in a range from approximately 2 microns to approximately 40 microns, such as from 4 microns to 20 microns, although smaller or larger thicknesses may also be used. The total number of levels of wiring in each die-side redistribution structure 440 (i.e., the levels of the die-side redistribution wiring interconnects 444) may be in a range from 1 to 12, such as from 2 to 8. The total height of the die-side redistribution structure 440 may be in a range from 30 microns to 300 microns, although smaller or larger heights may also be used.

In one embodiment, the thicknesses of the die-side redistribution dielectric layers 442 and the die-side redistribution wiring interconnects 444 may be selected such that die-side redistribution wiring interconnects 444 provided at different wiring levels have different thicknesses. Thick die-side redistribution wiring interconnects 444 may be used to provide low resistance conductive paths. Thin die-side redistribution wiring interconnects 444 may be used to provide shielding from electromagnetic interference (EMI).

The pattern of the die-side redistribution wiring interconnects 444 in the bottommost level of the die-side redistribution structure 440 may include via structures that contact metal bonding structures 578 of the silicon substrate interposers 500 (described below with reference to FIG. 5), metal bonding structures 678 of the integrated passive devices 600 (described below with reference to FIGS. 6A and 6B), and TMCV structures 436.

The die-side bonding pads 448 may be formed on the topmost one of the die-side redistribution dielectric layers 442. For example, a copper seed layer may be deposited on the die-side redistribution dielectric layers 442 by sputtering (i.e., physical vapor deposition). The thickness of the copper seed layer may be in a range from 50 nm to nm. A photoresist layer (not shown) may be applied over the copper seed layer, and may be lithographically patterned to form openings within each dies in the pattern of an array of bonding pads. Copper may be electroplated within the openings in the photoresist layer. The thickness of the electroplated copper may be in a range from 5 microns to 50 microns, such as from 10 microns to 20 microns, although smaller and larger thicknesses may also be used.

The die-side bonding pads 448 may have horizontal cross-sectional shapes of rectangles, rounded rectangles, or circles. The photoresist layer may be removed by ashing, and horizontal portions of the copper seed layer between electroplated copper portions may be etched back, for example, using a wet etch process. Remaining discrete portions of copper include the die-side bonding pads 448, which are bonding pads that are subsequently used to attach solder material portions to be bonded to a respective semiconductor die.

A first subset of the die-side redistribution wiring interconnects 444 within the die-side redistribution structure 440 (e.g., see FIG. 3) may include segments of vertical signal paths that are connected to through-silicon via (TSV) structures 514 (e.g., see FIG. 5 and related description, below) that may be surrounded by a through-substrate insulating spacer 512. An insulating material may be conformally deposited into the array of openings and over the front-side surface of the silicon substrate 510 to form through-substrate insulating spacers 512. The insulating material of the through-substrate insulating spacer 512 may include silicon oxide (such as TEOS oxide) and/or silicon nitride. The thickness of the through-substrate insulating spacer 512 may be in a range from 1% to 30%, such as from 2% to 15%, of the maximum lateral dimension of each opening in the silicon substrate 510. For example, the through-substrate insulating spacer 512 may have a thickness in a range from 100 nm to 1,000 nm, although lesser and greater thicknesses may also be used.

A second subset of the die-side redistribution wiring interconnects 444 within the die-side redistribution structure 440 includes horizontally-extending portions of chip-to-chip signal paths that may be used to provide direct communication between at least two semiconductor dies to be subsequently attached to the interposer structure 400. The chip-to-chip signal paths may include a subset of the metal interconnect structures 564 (e.g., see FIG. 5 and related description, below) within at least one silicon substrate interposer 500 to provide high areal wiring density in a plan view (i.e., in a view along a vertical direction). In such an embodiment, at least two semiconductor dies (e.g., see FIG. 4 and related description, below) may be electrically isolated from the package-side redistribution wiring interconnects 414 and from the TMCV structures 436 to reduce or eliminate cross-talk with vertically-propagating signals that pass through the TSV structures 514 (e.g., see FIG. 5) or the TMCV structures 436 (e.g., see FIG. 4). The TMCV structures 436 electrically connect a respective pair of a die-side redistribution wiring interconnect 444 within the die-side redistribution structure 440 and a package-side redistribution wiring interconnect 414 within the package-side redistribution structure 410.

Figure 4:
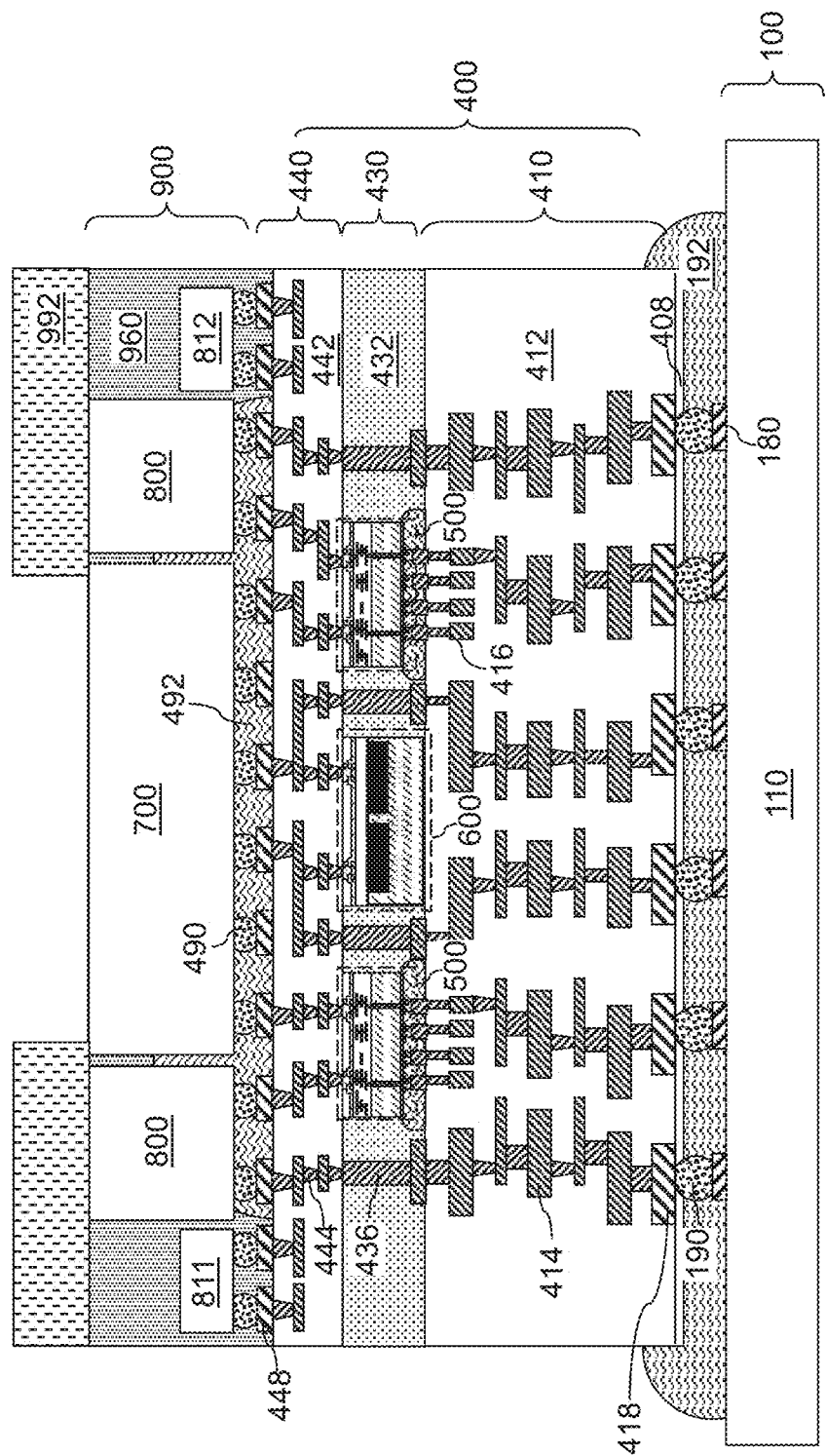
FIG. 4 is a vertical cross sectional view of an exemplary structure having a fan-out wafer-level package including a plurality of semiconductor dies, according to various embodiments.

FIG. 4 is a vertical cross sectional view of an exemplary structure in which a FOWLP 900 including a plurality of semiconductor dies (700, 800) and an EMC multi-die frame 960 has been attached to the silicon interposer 400 of FIG. 3, according to various embodiments. Also, as shown in FIG. 4, the carrier substrate 300 (e.g., see FIG. 3) has been removed and the silicon interposer 400 has been bonded to a printed circuit board (PCB) 100 including a PCB substrate 110 and PCB bonding pads 180. An array of solder joints 190 may be formed to bond the package-side bonding pads 418 to the PCB bonding pads 180. The solder joints 190 may be formed by disposing an array of solder balls between the array of package-side bonding pads 418 and the array of PCB bonding pads 180, and by reflowing the array of solder balls. Optionally, a package-side dielectric cap layer 408 (such as a silicon oxide layer) may be deposited over the package-side bonding pads 418. The package-side dielectric cap layer 408 may be patterned to form an array of openings so that a surface of a respective one of the package-side bonding pads 418 is physically exposed in each opening through the package-side dielectric cap layer.

An underfill material portion 192 may be formed around the solder joints 190 by applying and shaping an underfill material. The FOWLP 900 is attached to the silicon interposer 400 by connecting solder portion 490 to die-side bonding pads 448. The FOWLP 900 further includes at least one underfill material portion 492 that is embedded within the EMC multi-die frame 960 along with the plurality of semiconductor dies (700, 800).

In one embodiment, at least one passive device component (811, 812) may be optionally attached to the die-side redistribution structure 440 through additional solder material portions 490. The at least one passive device component (811, 812) may include any passive device such as a capacitor, an inductor, an antenna, etc. The at least one passive device component (811, 812) may be embedded within the EMC multi-die frame 960.

Optionally, a stabilization structure 992, such as a cap structure or a ring structure, may be attached to the assembly of the EMC matrix to reduce deformation of the assembly of the two-dimensional array of interposer structures 400, the EMC matrix, and the semiconductor dies (700, 800) embedded therein during subsequent processing steps. The stabilization structure 992 may counteract the tendency for the EMC die frame 960 to crack under stress around the periphery of the semiconductor dies (700, 800) in case the area of the EMC die frame 960 becomes relatively large. The stabilization structure 992, which may be embodied as a cap structure or a ring structure, may be attached to each EMC die frame 960 to reduce deformation of the assembly during subsequent processing steps and/or during usage of the assembly. for example, the stabilization structure 992 may be attached to the top surface of the EMC die frame 960, and may extend inwardly over the periphery of the assembly of the semiconductor dies (700, 800). In one embodiment, the stabilization structure 992 may include a metal ring structure.

Figure 5:
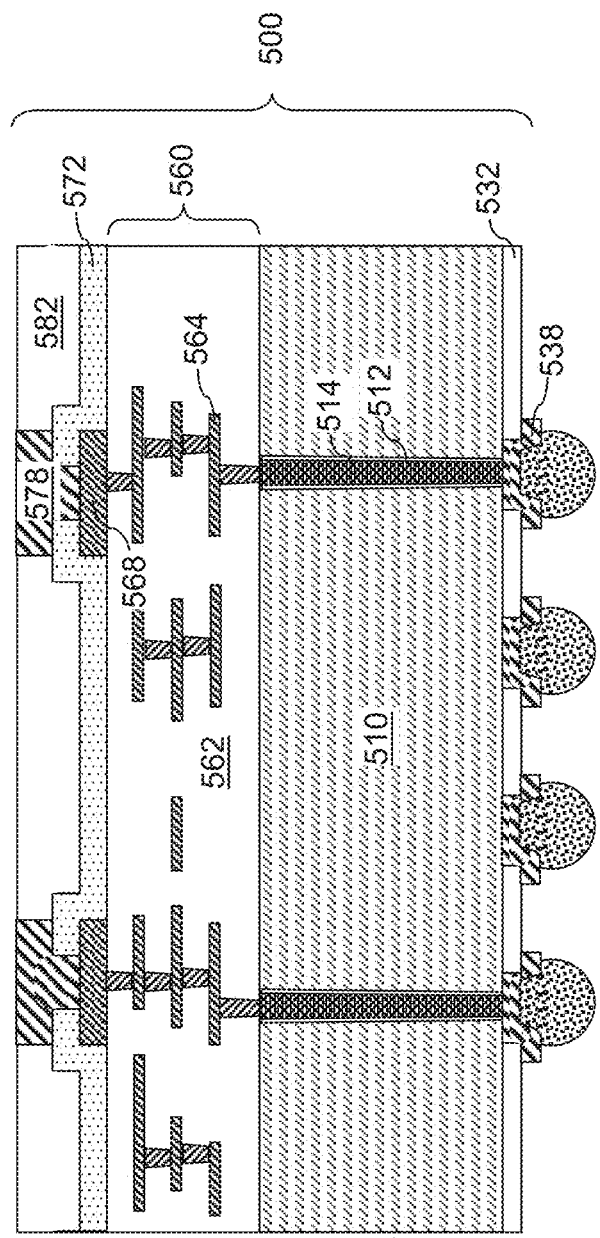
FIG. 5 is vertical cross sectional view of a silicon substrate interposer, according to various embodiments.

FIG. 5 is vertical cross sectional view of a silicon substrate interposer 500, according to various embodiments. The silicon substrate interposer 500 includes a silicon substrate 510, a respective set of TSV structures 514 vertically extending through the respective silicon substrate 510, a set of interconnect-level dielectric layers 562 embedding a respective set of metal interconnect structures 564, a set of metal bonding structures 578 that are electrically connected to a subset of die-side redistribution wiring interconnects 444 (e.g., see FIG. 3); and a set of backside bonding pads 538 that are electrically connected to package-side redistribution wiring interconnects 414 (e.g., see FIG. 3) through a respective array of micro-bumps 416 (e.g., see FIG. 3). In one embodiment, at least one set of metal interconnect structures 564 within the at least one silicon substrate interposer 500 is configured to provide electrically conductive paths that connect a respective pair of the die-side redistribution wiring interconnects 444 (e.g., see FIGS. 3 and 4) and are electrically isolated from the package-side redistribution wiring interconnects 414 (e.g., see FIGS. 3 and 4).

A total number of metal line levels in the interconnect-level structure 560 may be in a range from 2 to 12, such as from 3 to 6, although smaller and larger numbers of metal line levels may also be used. Metal pad structures 568 may be formed at the topmost level of the interconnect-level structure 560. A passivation dielectric layer 572 such as a silicon nitride layer may be deposited over the metal pad structures 568. The thickness of the passivation dielectric layer 572 may be in a range from approximately 30 nm to approximately 100 nm. Metal bonding structures 578 may be formed on each metal pad structure 568. The metal bonding structures 578 may be configured for C4 (controlled collapse chip connection) bonding, or may be configured for C2 bonding. In embodiments in which the metal bonding structures 578 are configured for C4 bonding, the metal bonding structures 578 may include copper pads having a thickness in a range from approximately 5 microns to approximately 30 microns and having a pitch in a range from 40 microns to 100 microns. In embodiments in which the metal bonding structures 578 are configured for C2 bonding, the metal bonding structures 578 may include copper pillars having a diameter in a range from approximately 10 microns to approximately 30 microns and having a pitch in a range from 20 microns to 60 microns. In such an embodiment, the copper pillars may be subsequently capped with a solder material to provide C2 bonding.

Subsequently, a temporary carrier substrate (not shown) may be attached to the metal bonding structures 578 and the optional pad-level dielectric layer 582. A temporary adhesive layer (not shown) may be used to attach the temporary carrier substrate to the surfaces of the metal bonding structures 578 and the optional pad-level dielectric layer 582. The temporary carrier substrate may have the same size as the silicon wafer.

The backside of the silicon wafer may be thinned until bottom surfaces of the TSV structures 514 are physically exposed. The thinning of the silicon wafer may be effected, for example, by grinding, polishing, an isotropic etch process, an anisotropic etch process, or a combination thereof. For example, a combination of a grinding process, an isotropic etch process, and a polishing process may be used to thin the backside of the silicon wafer. The thickness of the silicon wafer after thinning may be in a range from 20 microns to 150 microns, such as from 50 microns to 100 microns. The thickness of the silicon wafer after thinning is thin enough to physically expose backside surfaces (i.e., bottom surfaces) of the TSV structures 514, and is thick enough to provide sufficient mechanical strength to each silicon substrate 510 upon dicing the semiconductor wafer.

At least one dielectric material such as silicon nitride and/or silicon oxide may be deposited over the backside surface of the silicon wafer and over the physically exposed end surfaces of the TSV structures 514 to form a backside insulating layer 532. The thickness of the backside insulating layer 532 may be in a range from 100 nm to 1,000 nm, such as from 200 nm to 500 nm, although lesser and greater thicknesses may also be used. Openings are formed through the backside insulating layer 532, for example, by applying and lithographically patterning a photoresist layer, and transferring the pattern of the openings in the photoresist layer through the backside insulating layer 532 using an anisotropic etch process. A bottom surface of each TSV structure 514 may be physically exposed. The photoresist layer may be subsequently removed, for example, by ashing. At least one conductive material may be deposited on the physically exposed bottom surfaces of the TSV structures 514, and may be patterned to form backside bonding pads 538.

FIG. 6A is a vertical cross sectional view of an integrated passive device 600, according various embodiments. The integrated passive device 600 may include any passive device that may be formed within, or on, a substrate such as a silicon substrate 610, a dielectric substrate, or a metallic substrate. For example, the integrated passive device 600 may include at least one capacitor, at least one inductor, at least one resistor, at least one diode, at least one antenna, or any other passive electrical component. In this example, the integrated passive device 600 may include a first die 712a and a second die 712b.

The configuration of FIG. 6A is only illustrative, and other embodiment may include any other configuration for capacitors or for any other integrated passive device. The silicon substrate 610 may be provided as a portion of a silicon wafer having a plurality of integrated passive device dies (712a, 712b, etc.) formed thereon.

In other words, a two-dimensional array of dies (712a, 712b, etc.) each including a respective passive device may be formed, and may be subsequently diced, along scribe lines 714, to provide a silicon substrate 610 having one or more dies (712a, 712b, etc., as described below with reference to FIGS. 7 to 8C).

An interconnect-level structure 660 including interconnect-level dielectric layers 662 and metal interconnect structures 664 may be formed on the front-side surface of the silicon wafer prior to dicing. The interconnect-level dielectric layers 662 may include a respective dielectric material layer such as silicon oxide, organosilicate glass, silicon nitride, or any other dielectric material that may be used as interconnect-level insulating layers. The metal interconnect structures 664 may include metal lines and metal via structures. For example, a thickness of each metal line and the thickness of each metal via may be in a range from approximately 100 nm to approximately 1,000 nm, such as from approximately 150 nm to approximately 600 nm, although other embodiments may include smaller or larger thicknesses. The metal interconnect structures 664 may include copper, aluminum, tungsten, molybdenum, ruthenium, or other transition metals that may be formed as patterned structures. Other suitable materials may be within the contemplated scope of disclosure.

A total number of metal line levels in the interconnect-level structure 660 may be in a range from 1 to 8, such as from 2 to 4, although smaller and larger numbers of metal line levels may also be used. Metal pad structures 668 may be formed at the topmost level of the interconnect-level structure 660. A passivation dielectric layer 672 such as a silicon nitride layer may be deposited over the metal pad structures 668. The thickness of the passivation dielectric layer 672 may be in a range from approximately 30 nm to approximately 100 nm. Metal bonding structures 682 may be formed on each metal pad structure 668. The metal bonding structures 678 may be configured for C4 (controlled collapse chip connection) bonding, or may be configured for C2 bonding. The semiconductor wafer with the interconnect-level structure 660 may be subsequently diced, along scribe lines 714, to provide a plurality of integrated passive devices 600. At least one of the integrated passive devices 600 may be optionally subsequently incorporated into a structure including an interposer, according to various embodiments.

Figure 6B:
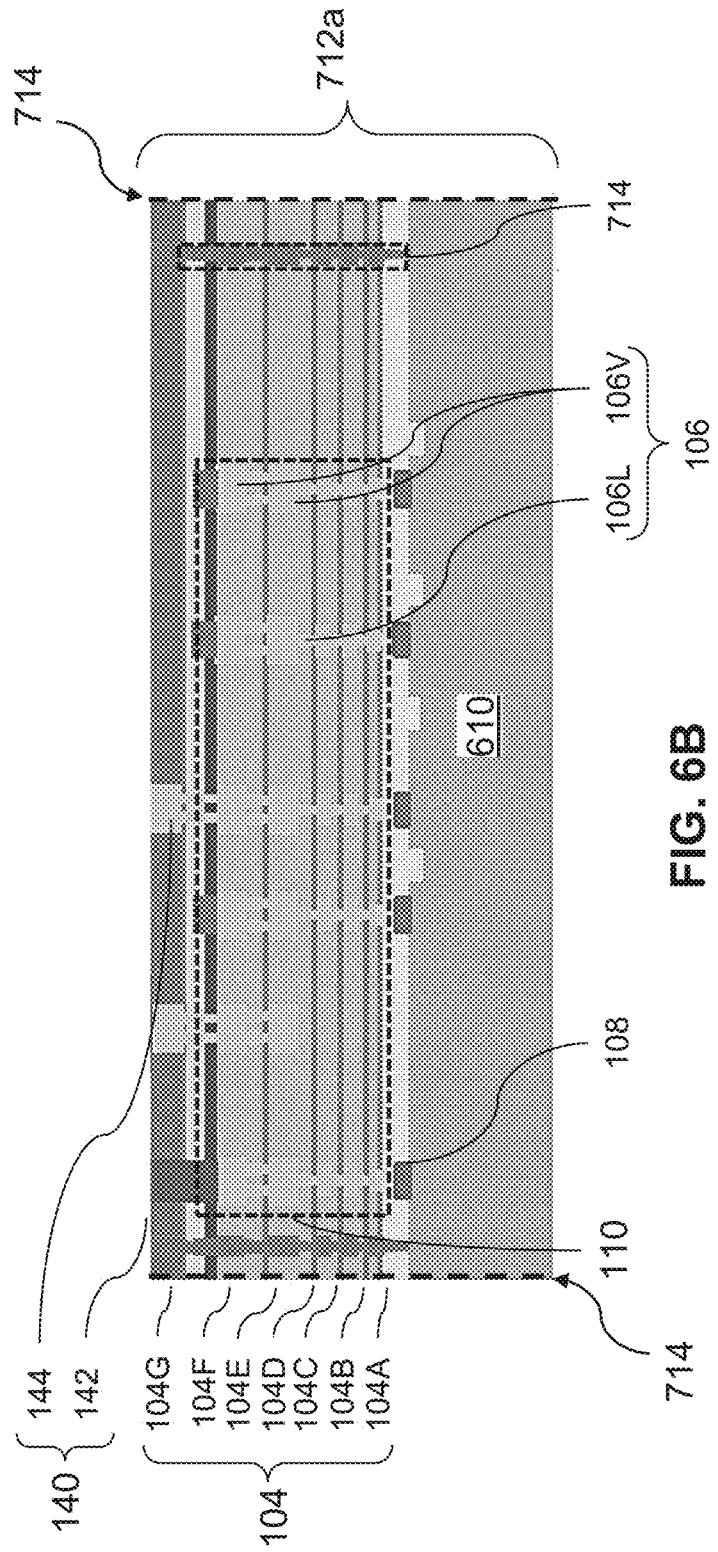
FIG. 6B is a vertical cross sectional view of a first integrated passive device die of FIG. 6A, according to various embodiments.

FIG. 6B is a vertical cross sectional view of the first die 712a of FIG. 6A, according to various embodiments. As described above, the first die 712a may be an integrated passive device die. In other embodiments, the first die 712a may be, for example, an application-specific integrated circuit (ASIC) chip, an analog chip, a sensor chip, a wireless and radio frequency chip, a voltage regulator chip or a memory chip. In some embodiments, the first die 712a may be an active component or a passive component. In some embodiments, the first die 712a includes the semiconductor substrate 610, a dielectric structure 104, an interconnect structure 110 embedded within the dielectric structure 104, a seal ring 714, and a bonding structure 140.

In some embodiments, the semiconductor substrate 610 may include an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 610 may be a semiconductor-on-insulator (SOI) substrate. In various embodiments, the semiconductor substrate 610 may take the form of a planar substrate, a substrate with multiple fins, nanowires, or other forms known to persons of ordinary skill in the art. Depending on the requirements of design, the semiconductor substrate 610 may be a P-type substrate or an N-type substrate and may have doped regions therein. The doped regions may be configured for an N-type device or a P-type device.

In some embodiments, the semiconductor substrate 610 includes isolation structures defining at least one active area, and a device layer may be disposed on/in the active area. The device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the device layer includes a gate structure, source/drain regions, spacers, and the like.

The dielectric structure 104 may be disposed on a front side of the semiconductor substrate 610. In some embodiments, the dielectric structure 104 includes silicon oxide, silicon oxynitride, silicon nitride, a low dielectric constant (low-k) material, or a combination thereof. The dielectric structure 104 may be a single layer or a multiple-layer dielectric structure. For example, as shown in FIG. 6B, the dielectric structure 104 may include multiple dielectric layers, such as a substrate planarization layer 104A, interlayer dielectric (ILD) layers 104B-104F, and an interconnect planarization layer 104G. However, while FIG. 6B illustrates seven dielectric layers, the various embodiments of the present disclosure are not limited to any particular number of layers, more or fewer layers may be used.

The dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, etc.

An interconnect structure 110 may be formed in the dielectric structure 104. The interconnect structure 110 may include metal features 106 disposed in the dielectric structure 104. The metal features 106 may be any of a variety of vias (106V) and metal lines (106L). The metal features 106 may be formed of any suitable electrically conductive material, such as tungsten (W), copper (Cu), a copper alloy, aluminum (Al), an aluminum alloy, combinations thereof, etc. In some embodiments, barrier layers (not shown) may be disposed between the metal features 106 and the dielectric layers of dielectric structure 104, to prevent the material of the metal features 106 from migrating to the semiconductor substrate 610. The barrier layer may include Ta, TaN, Ti, TiN, CoW, or combinations thereof, for example. Other suitable barrier layer materials are within the contemplated scope of disclosure.

The metal features 106 may include electrically conductive lines 106L and via structure 106V. The via structures 106V may operate to electrically connect conductive lines 106L disposed in adjacent dielectric layers 104B-104F. The metal features 106 may be electrically connected to pads 108 disposed on the semiconductor substrate 610, such that the interconnect structure 110 may electrically connect semiconductor devices formed on the semiconductor substrate 610 to various pads and nodes.

The seal ring 714 may extend around the periphery of the first die 712a. For example, the seal ring 714 may be disposed in the dielectric structure 104 and may laterally surround the interconnect structure 110. The seal ring 714 may be configured to protect the interconnect structure 110 from contaminant diffusion and/or physical damage during device processing, such as plasma etching and/or deposition processes.

The seal ring 714 may include copper at an atomic percentage greater than 80%, such as greater than 90% and/or greater than 95% although greater or lesser percentages may be used. The seal ring 714 may include conductive lines and via structures that may be connected to each other, and may be formed simultaneously with the conductive lines 106L and via structures 106V of the metal features 106 of the interconnect structure 110. The seal ring 714 may be electrically isolated from the metal features 106.

In some embodiments, the metal features 106 and/or the seal ring 714 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the metal features 106 and/or the seal ring 714 may be may be formed by an electroplating process.

For example, the Damascene processes may include patterning the dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the dielectric structure 104.

The patterning, metal deposition, and planarizing processes may be performed for each of the dielectric layers 104A-104G, to thereby form the interconnect structure 110 and/or the seal ring 714. For example, dielectric layer 104A may be deposited and patterned to form openings. A deposition process may then be performed to fill the openings in the dielectric layer 104A. A planarization process may then be performed to remove the overburden and form metal features 106 in the dielectric layer 104A. These process steps may be repeated to form the dielectric layers 104B-104F and the corresponding metal features 106, and thereby complete the interconnect structure 110 and/or seal ring 714.

The first die 712a may include a bonding structure 140 disposed over the dielectric structure 104. The bonding structure 140 may include a dielectric bonding layer 142 and one or more bonding features 144. The bonding layer 142 may be formed by depositing a dielectric material, such as silicon oxide, silicon nitride, a polymer, or a combination thereof, using any suitable deposition process. The bonding features 144 may be disposed in the bonding layer 142. The bonding features 144 may be electrically conductive features formed of the same materials as the metal features 106. For example, the bonding features 144 may include tungsten (W), copper (Cu), a copper alloy, aluminum (Al), an aluminum alloy, or a combination thereof. Other suitable bonding structure materials are within the contemplated scope of disclosure. The bonding features 144 may include bonding pads and/or via structures, in some embodiments.

The bonding features 144 may be formed in the bonding layer 142 by a dual-Damascene processes, or by one or more single-Damascene processes, as described above. In alternative embodiments, the bonding features 144 may be formed by an electroplating process.

FIG. 7 is a plan view of a semiconductor wafer 704 having a plurality of integrated passive devices 712 formed thereon, according to various embodiments. The integrated passive devices 712 may include any integrated passive device, as described above. For example, the integrated passive devices may include one or more capacitor structures such as the capacitor structure formed in the integrated passive device 600, described above with reference to FIGS. 6A and 6B. In other embodiments, the integrated passive device may include a resistor, an inductor, a diode, an antenna, or any other passive electrical component, or combination of passive elements.

The semiconductor wafer 704 may be diced to generate a plurality of integrated passive device dies 712. Such integrated passive device dies 712 may then be incorporated into other device structures. For example, an integrated passive device die 712 may be incorporated into a FOWLP structure such as the structures described above with reference to FIGS. 2 and 4. For example, integrated passive device dies 712 may be coupled to an interposer 400 (e.g., see integrated passive device dies 811 and 812), as described above with reference to FIG. 4. Alternatively, integrated passive device dies 712 may be formed as part of an interposer core 430 structure (e.g., see integrated passive device die 600), as described above with reference to FIG. 4. Various device structures may be formed by coupling integrated passive device dies 712 with organic interposers 400 (e.g., see FIGS. 1A and 1B and related description), with silicon interposers 400 (e.g., see FIGS. 3, 4, and 5), or with combinations of organic and silicon interposers.

Each integrated passive device die 712 may have certain electrical properties. For example, the integrated passive device dies 712 may have a capacitance C, in instances in which the integrated passive device dies 712 include a capacitor structure (e.g., see integrated passive device dies 600 of FIGS. 6A and 6B). Alternatively, the integrated passive device dies 712 may have a inductance L or a resistance R, in instances in which the integrated passive device dies 712 include inductors or resistors, respectively. A plurality of integrated passive device dies 712 may be incorporated into a semiconductor device package structure, such as the FOWLP structures of FIGS. 2 and 4. As such, the various integrated passive device dies 712 may be wired in series or in parallel as needed to provide desired electrical properties for a given structure.

For certain device structures, however, it may be inconvenient to include a plurality of individual integrated passive device dies 712. In this regard, the physical size and fixed electrical properties of integrated passive device dies 712 constrain the possibilities for circuit design. In certain applications it may be more convenient to have an integrated passive device die 802 that has a plurality of integrated passive devices 712 on a given die 802, as described in greater detail with reference to FIGS. 8A and 8B, below.

FIG. 8A is a plan view of a further semiconductor wafer 814 having a plurality of integrated passive devices 712 formed thereon, and FIG. 8B is a plan view of a portion 802 of the semiconductor wafer 814 of FIG. 8A, according to various embodiments. In contrast to the semiconductor wafer 704 of FIG. 7, the semiconductor wafer 814 is constructed such that it may be diced in various ways. For example, an integrated passive device die 802 having six integrated passive devices 712 (e.g., see FIG. 8B) may be generated by dicing the semiconductor wafer 814 along the dashed lines indicated in FIG. 8A that define portion area D.

Alternatively, the semiconductor wafer 814 may be diced in other ways to generate an integrated passive device die having various numbers of integrated passive devices 712. For example, the semiconductor wafer may be diced to have a single integrated passive device 712, as described above with reference to FIG. 7. The semiconductor wafer 814 may also be diced to generate an integrated passive device die having two, four, eight, etc., integrated passive devices 712. In such embodiments, a sized of the resulting integrated passive device die 802 may be a multiple of a portion area D associated with each integrated passive device.

Each integrated passive device 712 may be formed with a seal ring 714 that is configured to protect each integrated passive device 712 during the process of dicing the semiconductor wafer 814. Each seal ring 714 may extend around a periphery of each respective integrated passive device 712. The seal ring 714 may be further configured to protect the integrated passive device 712 from contaminant diffusion and/or physical damage during device processing, such as plasma etching and/or deposition processes.

The seal ring 714 may include copper at an atomic percentage greater than 80%, such as greater than 90% and/or greater than 95% although larger or smaller percentages may be used. The seal ring 714 may include conductive lines and via structures that may be connected to each other, or the seal ring 714 may be electrically isolated from other structures in the semiconductor wafer 814. In some embodiments, the seal ring 714 may be formed by a dual-Damascene process or by multiple single Damascene processes. Single-Damascene processes generally form and fill a single feature with copper per a Damascene stage. Dual-Damascene processes generally form and fill two features with copper at once. For example, a trench and overlapping through-hole may both be filled with a single copper deposition using dual-Damascene processes. In alternative embodiments, the seal ring 714 may be may be formed by an electroplating process.

As described above, each integrated passive device 712, having a seal ring 714, may have an associated area, such that an area of an integrated passive device die 802 is a multiple of each the area associated with each integrated passive device 712 and seal ring 714. The area associated with each integrated passive device 712 and seal ring 714 may be chosen such that a predetermined distance 804 is formed at edges of the integrated passive device die 802. In this regard, when the semiconductor wafer 814 is diced to generate an integrated passive device die 802, the predetermined distance 804 is approximately half of a distance 810 between neighboring seal rings 714 associated with respective integrated passive devices 712, as described in greater detail with reference to FIG. 8C, below.

Figure 8C:
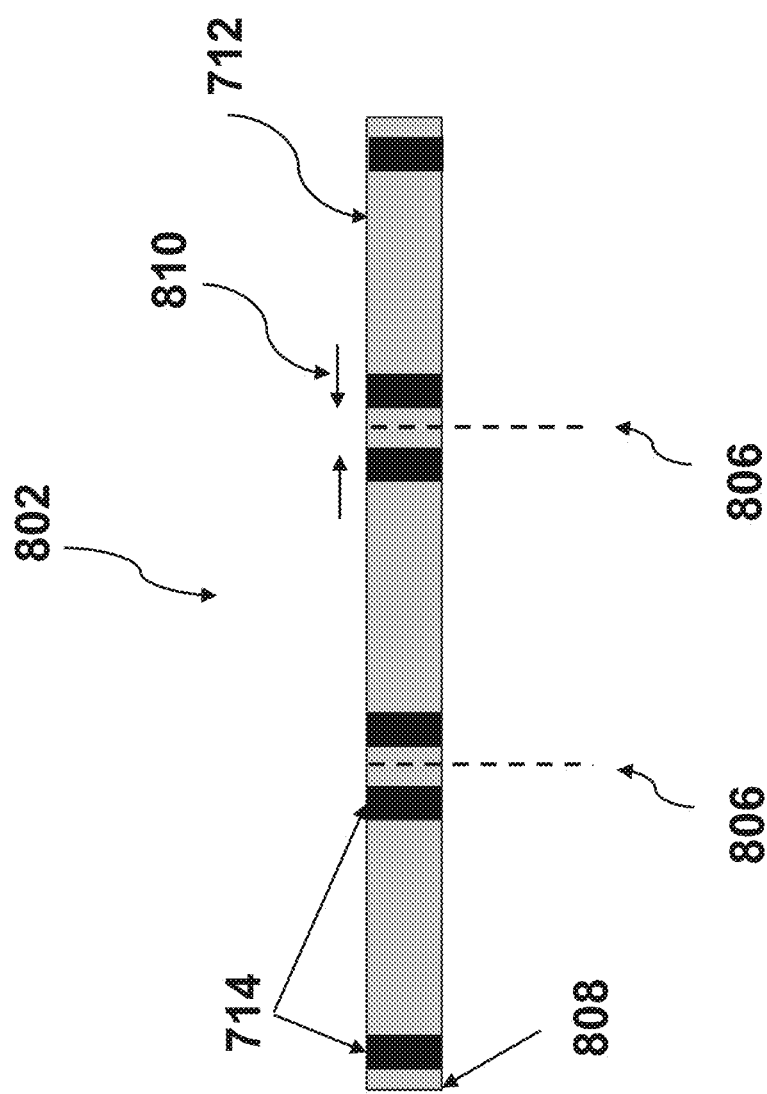
FIG. 8C is an edge view of the integrated passive device die of FIG. 8B, according to various embodiments.

FIG. 8C is an edge view of the portion 802 of the semiconductor wafer of FIG. 8A, according to various embodiments. As shown in FIG. 8C, each structure including the integrated passive device 712 and seal ring 714 may be separated by scribe lines 806. The scribe lines 806 may be provided between each neighboring integrated passive device 712 and seal ring 714 formed on the semiconductor wafer 814. The scribe lines 806 allow the semiconductor wafer 814 to be diced in various ways to thereby generate integrated passive device dies 802 having various numbers of integrated passive devices 712. As such, the scribe lines 806 may thereby divide an area of the semiconductor wafer 814 into a plurality of unit cells, with each unit cell including an integrated passive device 712 and seal ring 714.

As shown in FIG. 8C, an area of each unit cell may be chosen such that adjacent seal rings 714 are separated by a distance 810. Dicing the semiconductor wafer 814 (e.g., see FIG. 8A) along scribe lines 806 (e.g., see FIG. 8C) thereby divides the distance 810 leaving a distance 804 between an edge 808 of the resulting integrated passive device die 802 and seal rings 714 adjacent to the edge 808 of the integrated passive device die 802, as described above with reference to FIG. 8B.

Figure 9:
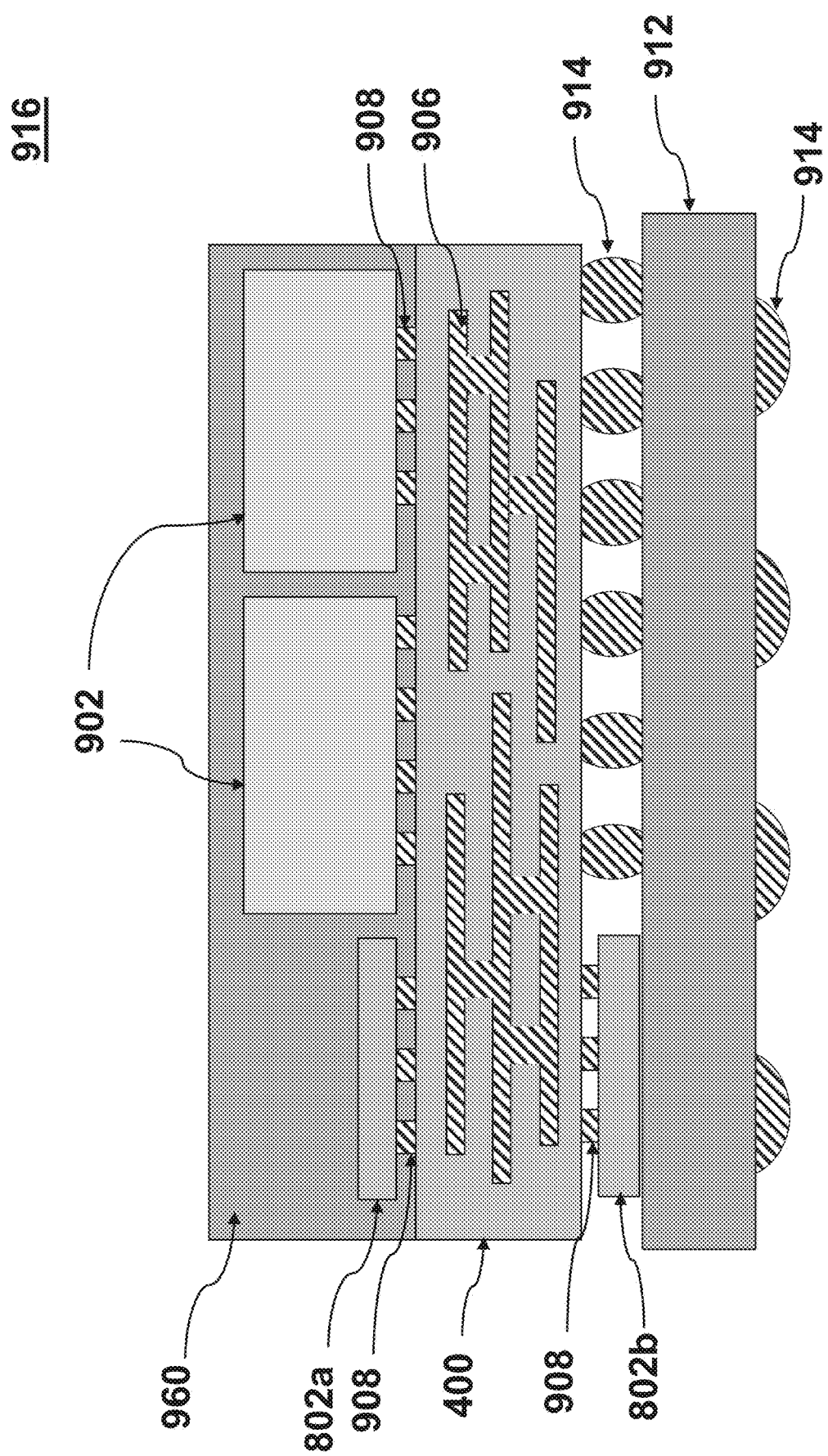
FIG. 9 is a vertical cross sectional view of an exemplary structure having a fan-out wafer-level package including a plurality of semiconductor dies and integrated passive device dies, according to various embodiments.

FIG. 9 is a vertical cross sectional view of a chip package structure 916 having a FOWLP including a plurality of semiconductor dies 902 and integrated passive device dies 802a, 802b, according to various embodiments. The chip package structure 916 may include an interposer 400 having a redistribution interconnect structure 906. The semiconductor device dies 902 may be electrically coupled to the interposer 400 via a plurality solder portions 908 that connect respective bonding pads or micro-bumps (not shown) of the respective semiconductor device dies 902 and the interposer 400. The integrated passive device dies 802a, 802b may similarly be electrically coupled to the interposer 400 via a plurality solder portions 908 that connect respective bonding pads or micro-bumps (not shown) of the respective integrated passive device dies 802a, 802b and the interposer 400. As described above, EMC may be applied to gaps formed between the interposer 400, the semiconductor dies 902, and the integrated passive device dies 802a to thereby form an EMC multi-die frame 960.

The chip package structure 916 including the plurality of semiconductor dies 902, the interposer 400, and integrated passive device dies 802a, 802b may further be coupled to a substrate 912 via solder portions 914 that may couple respective bonding pads or bump structure of the respective interposer 400 and the substrate 912. The substrate 912 may further be electrically coupled to a PCB (not shown) via solder portions 914 that connect respective bump structures of the substrate 912 and PCB.

The chip package structure 916 may be similar to various other structures described above. For example, the interposer 400 may be an organic interposer, as described above with reference to FIGS. 1A to 2. Alternatively, the interposer 400 may be a silicon interposer 400, as described above with reference to FIGS. 3 to 5. The integrated passive device dies 802a and 802b may be configured in various ways. For example, the integrated passive device dies 802a and 802b may have a plurality of integrated passive devices 712 and seal rings 714, as described above with reference to FIG. 8B. Further, the integrated passive device die 802a may be coupled to a top surface of the interposer 400 and the integrated passive device die 802b may be coupled to a bottom surface of the interposer.

In certain embodiments, the integrated passive device dies 802a and 802b may have an equal number of integrated passive devices 712 and seal rings 714. In other embodiments, it may be advantages for one of the integrated passive device dies 802a and 802b to have a greater number of integrated passive devices 712 and seal rings 714 than the other of integrated passive device dies 802a and 802b. The integrated passive device dies 802a and 802b may include a plurality of micro-bumps that may be coupled to respective micro-bumps of the interposer 400, as described in greater detail with reference to FIGS. 10A and 10B, below.

Figure 10B:
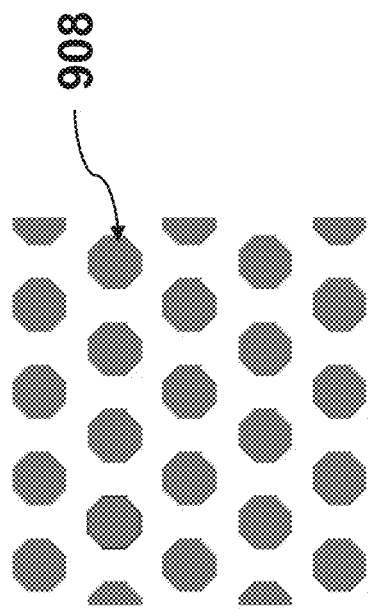
FIG. 10B is a plan view of a plurality of micro-bumps in a staggered configuration, according to various embodiments.
Figure 10A:
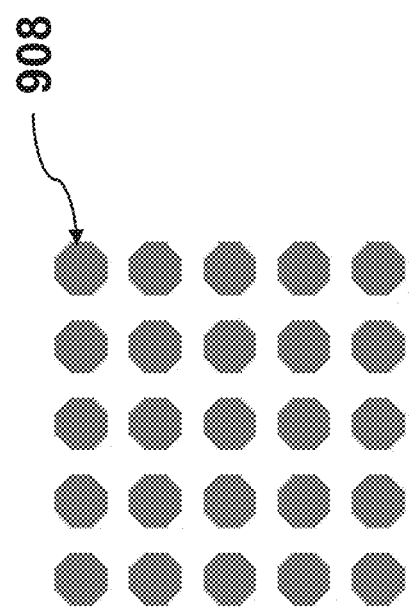
FIG. 10A is a plan view of a plurality of micro-bumps in an array configuration, according to various embodiments.

FIG. 10A is a plan view of a plurality of micro-bumps 908 in an array configuration, and FIG. 10B is a plan view of a plurality of micro-bumps 908 in a staggered configuration, according to various embodiments. The micro-bumps 908 may be configured to have a pitch that is in a range from approximately 20 microns to approximately 100 microns. Further, at least some of the micro-bumps 908 may have a spacing corresponding to a spacing of electrical bonding pads or micro-bumps (not shown) of the interposer 400. In this way, the integrated passive device dies 802a and 802b may be configured to be electrically connected to the interposer 400 by bonding the at least some of the micro-bumps 908 of the integrated passive device dies 802a and 802 to respective bonding pads or micro-bumps (not shown) of the interposer 400.

Figure 11:
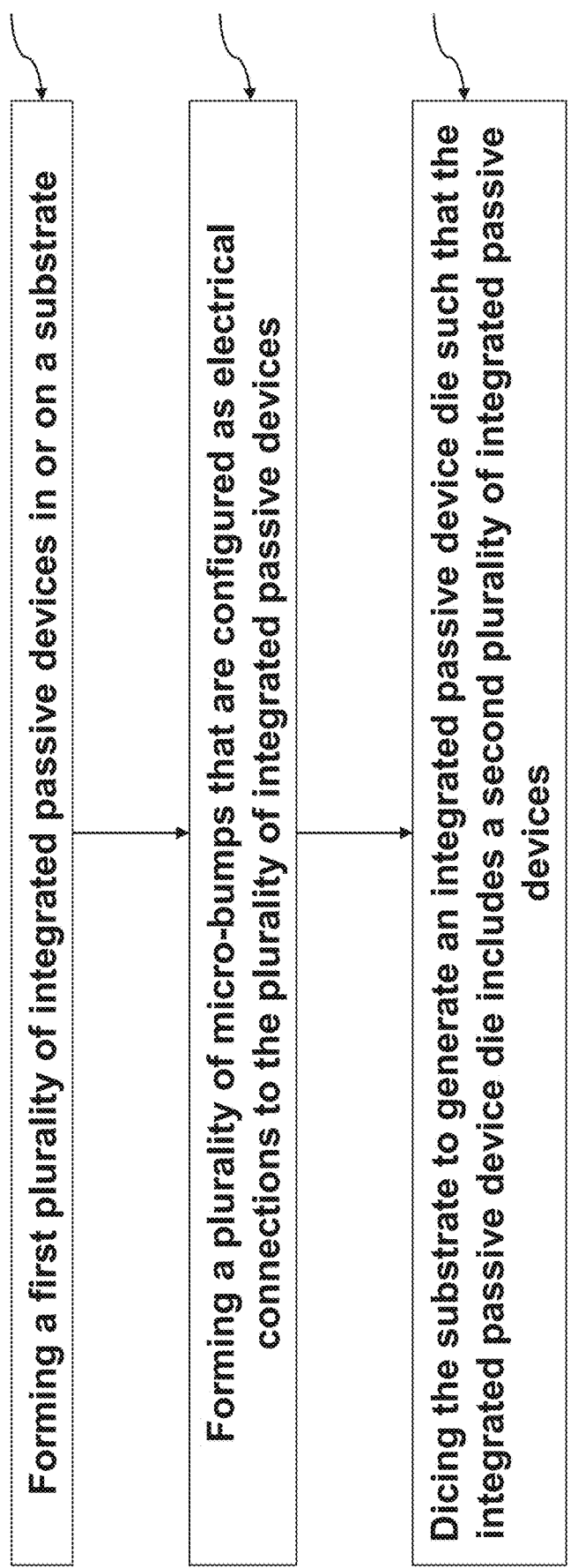
FIG. 11 is a flowchart showing operations of a method of fabricating an integrated passive device die, according to various embodiments.

FIG. 11 is a flowchart showing operations of a method 1100 of fabricating an integrated passive device die 802, according to various embodiments. In operation 1102, the method 1100 may include forming a first plurality of integrated passive devices 712 (e.g., see FIGS. 8A and 8B) in or on a substrate (e.g., semiconductor wafer 814). In operation 1104, the method 1100 may further include forming a plurality of micro-bumps 908 (e.g., see FIGS. 10A and 10B) on the integrated passive devices 712 such that the plurality of micro-bumps 908 are configured as electrical connections to the plurality of integrated passive devices 712. The method 1100 may further include forming the micro-bumps 908 such that at least some of the micro-bumps 908 have a spacing corresponding to a spacing of electrical bonding pads (not shown) of an interposer 400 of a chip package structure 916 (e.g., see FIG. 9). In this way, the integrated passive device die 802a, 802b may be configured to be electrically connected to the interposer 400 by bonding the at least some of the micro-bumps 908 of the integrated passive device die 802a, 802b to respective bonding pads of the interposer 400.

In operation 1106, the method 1100 may include dicing the substrate (e.g., semiconductor wafer 814) to generate the integrated passive device die 802 (e.g., see FIG. 8B) such that the integrated passive device die 802 comprises a second plurality of integrated passive devices 712 (e.g., see FIG. 8B). In this way, the second plurality of integrated passive devices 712 (e.g., see FIG. 8B) is a subset of the first plurality of integrated passive devices (e.g., see FIG. 8A). Further, as described above, a size of the integrated passive device die 802 may be a multiple of an area associated with each integrated passive device 702.

The method 1100 may further include forming a seal ring 714 (e.g., see FIG. 8B) around each integrated passive device 712 in the first plurality of integrated passive devices. The method 1100 may further include forming a plurality of scribe lines 806 (e.g., see FIG. 8C) between integrated passive devices 712 in the first plurality of integrated passive devices 712 to thereby form a plurality of unit cells (e.g., areas between scribed lines 806) separated by scribe lines 806, such that each integrated passive device 712 is located in a respective unit cell (e.g., see FIG. 8C). The method 1100 may further include dicing the substrate along a subset of the scribe lines 806 to thereby form the integrated passive device die 802 (e.g., see FIGS. 8B and 8C). As described above, forming the plurality of scribe lines 806 may further include forming scribe lines 806 in spaces 810 between adjacent seal rings 714 in respective adjacent integrated passive devices 712 (e.g., see FIG. 8C).

The method 1100 may further include bonding at least some of the micro-bumps 908 of the integrated passive device die (802a, 802b) to respective bonding pads (not shown) of the interposer 400 such that the integrated passive device die (802a, 802b) is electrically connected to the interposer 400 and thereby forms a component of a chip package structure 916 (e.g., see FIG. 9).

With reference to FIGS. 1A-10B, various embodiments may include a chip package structure 916 (e.g., see FIG. 9) including an interposer 400, a semiconductor device die 902 electrically connected to the interposer 400; and an integrated passive device die 802 (e.g., see FIG. 8B) electrically connected to the interposer 400, the integrated passive device die 802 including two or more integrated passive devices 712 each surrounded by a respective closed seal ring 714 (e.g., see FIG. 8B). In an embodiment, as shown in FIG. 8C, the integrated passive device die 802 may include a plurality of unit cells (i.e., areas between scribe lines 806) separated by scribe lines 806 such that each integrated passive device 702 is located in a respective unit cell.

In another embodiment, integrated passive device die 802 each of the two or more integrated passive devices 712 electrical connections that are formed as a plurality of micro-bumps 908 (e.g., see FIGS. 10A and 10B). The micro-bumps 908 formed on the integrated passive devices 712 may have a pitch that is in a range from approximately 20 microns to approximately 100 microns. In one embodiment, the micro-bumps 908 may be arranged in an array (e.g., see FIG. 10A) or a staggered configuration (e.g., see FIG. 10B). In an embodiment, at least some of the micro-bumps 908 may have a spacing corresponding to a spacing of electrical bonding pads or micro-bumps (not shown) of an interposer 400 (e.g., see FIG. 9) such that the integrated passive device die (802a, 802b) is configured to be electrically connected to the interposer 400 by bonding the at least some of the micro-bumps 908 of the integrated passive device die (802a, 802b) to respective bonding pads of the interposer 400.

Further with reference to FIGS. 1A-10B, various embodiments may include a chip package structure 916 (e.g., see FIG. 9). The chip package structure 916 may include an interposer 400, a semiconductor device die 902 electrically connected to the interposer 400, and an integrated passive device die (802a, 802b) electrically connected to the interposer 400. The integrated passive device die (802a, 802b) may include a first substrate (e.g., portion B cut from semiconductor wafer 814, see FIGS. 8A and 8B) and a first plurality of integrated passive devices 714 formed in or on the substrate (e.g., see FIG. 8B). The each of the first plurality of integrated passive devices 712 may further include electrical connections that are formed as a plurality of micro-bumps 908 (e.g., see FIGS. 10A and 10B).

The integrated passive device die (802a, 802b) may be generated by dicing a second substrate (e.g., semiconductor wafer 814, see FIG. 8A) having a second plurality of integrated passive devices 712 (i.e., the larger set of integrated passive devices 712 on wafer 814) such that the first substrate is a portion of the second substrate and the first plurality of integrated passive devices is a subset of the second plurality of integrated passive devices (e.g., see FIGS. 8A and 8B).

In one embodiment (e.g., see FIG. 8C), the integrated passive device die 802 may include a plurality of unit cells (i.e., areas between scribe lines 806) separated by scribe lines 806 such that each integrated passive device 702 is located in a respective unit cell. In another embodiment, each integrated passive device 712 may include a seal ring 714. In one embodiment, the micro-bumps 908 formed on the integrated passive devices 712 may have a pitch that is in a range from approximately 20 microns to approximately 100 microns. In one embodiment, the micro-bumps 908 may be arranged in an array (e.g., see FIG. 10A) or a staggered configuration (e.g., see FIG. 10B). In one embodiment, at least some of the micro-bumps 908 may have a spacing corresponding to a spacing of electrical bonding pads or micro-bumps (not shown) of the interposer 400. At least some of the micro-bumps 908 may be bonded to respective bonding pads or micro-bumps (not shown) of the interposer 400 such that the integrated passive device die (802a, 802b) is electrically connected to the interposer 400.

The disclosed embodiments provide integrated passive device dies, and methods of forming the same, that have advantages over conventional integrated passive device dies. In this regard, conventional integrated passive device dies 712 have fixed size and electrical properties. As such, circuit designs may be limited by existing integrated passive device dies 712. In contrast, the disclosed integrated passive device dies 802 (e.g., see FIG. 8B) may be chosen to have a plurality of integrated passive devices 712. Further, the number of integrated passive devices 712 may be chosen by the way in which the semiconductor wafer 814 (e.g., see FIG. 8A) is diced. As such, a plurality of different types of integrated passive device dies 802, having different sizes and numbers of integrated passive devices 712, may be generated by dicing the semiconductor wafer 814 in various ways. As such, the disclosed systems and methods allow greater flexibility in the design and fabrication of integrated passive device dies 802 relative to conventional approaches.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A method of fabricating an integrated passive device die, the method comprising:
    forming a first plurality of integrated passive devices in or on a substrate;
    forming a plurality of micro-bumps on the integrated passive devices such that the plurality of micro-bumps are configured as electrical connections to each of the plurality of integrated passive devices;
    dicing the substrate to generate the integrated passive device die such that the integrated passive device die comprises a second plurality of integrated passive devices, and wherein the second plurality of integrated passive devices is a subset of the first plurality of integrated passive devices; and
    bonding at least some of the plurality of micro-bumps on the integrated passive device die to respective bonding pads or micro-bumps of an interposer such that the integrated passive device die is electrically connected to the interposer and forms a component of a chip package structure.

2. The method of claim 1, wherein forming the first plurality of integrated passive devices further comprises forming a seal ring around each of the first plurality of integrated passive devices.

3. The method of claim 2, further comprising:
    forming a plurality of scribe lines between each of the first plurality of integrated passive devices to thereby form a plurality of unit cells separated by scribe lines,
    wherein each integrated passive device is located in a respective unit cell, and
    wherein dicing the substrate further comprises dicing the substrate along a subset of the scribe lines to thereby form the integrated passive device die.

4. The method of claim 3, wherein forming the plurality of scribe lines further comprises forming scribe lines in spaces between adjacent seal rings in respective adjacent integrated passive devices.

5. The method of claim 1, further comprising forming the plurality of micro-bumps to have a pitch that is in a range from approximately 20 microns to approximately 100 microns.

6. The method of claim 1, further comprising forming the plurality of micro-bumps to be arranged in an array or a staggered configuration.

7. The method of claim 1, further comprising forming the plurality of micro-bumps such that at least some of the plurality of micro-bumps have a spacing corresponding to a spacing of electrical bonding pads or micro-bumps of the interposer of the chip package structure such that the integrated passive device die is configured to be electrically connected to the interposer by bonding the at least some of the plurality of micro-bumps of the integrated passive device die to respective bonding pads of the interposer.

8. A method of fabricating an integrated passive device die, the method comprising:
    forming a plurality of integrated passive devices on a substrate;
    forming a seal ring around each of the plurality of integrated passive devices;
    forming a plurality of scribe lines between each of the plurality of integrated passive devices to thereby form a plurality of unit cells separated by scribe lines; and
    dicing the substrate along a subset of the plurality of scribe lines to thereby form the integrated passive device die such that the integrated passive device die comprises a subset of the plurality of integrated passive devices.

9. The method of claim 8, wherein forming the plurality of scribe lines further comprises forming scribe lines in spaces between adjacent seal rings in respective adjacent integrated passive devices.

10. The method of claim 8, further comprising forming a plurality of micro-bumps on the integrated passive devices such that the plurality of micro-bumps are configured as electrical connections to each of the plurality of integrated passive devices.

11. The method of claim 10, further comprising forming the plurality of micro-bumps to be arranged in an array or a staggered configuration.

12. The method of claim 10, further comprising forming the plurality of micro-bumps such that at least some of the plurality of micro-bumps have a spacing corresponding to a spacing of electrical bonding pads or micro-bumps of an interposer of a chip package structure such that the integrated passive device die is configured to be electrically connected to the interposer by bonding the at least some of the plurality of micro-bumps of the integrated passive device die to respective bonding pads of the interposer.

13. The method of claim 12, further comprising bonding the at least some of the plurality of micro-bumps of the integrated passive device die to respective bonding pads or micro-bumps of the interposer such that the integrated passive device die is electrically connected to the interposer and forms a component of a chip package structure.

14. A method of fabricating a chip package structure, the method comprising:
   forming an interposer;
   forming a semiconductor device die such that the semiconductor device die is electrically connected to the interposer;
   forming a plurality of integrated passive devices, wherein each integrated passive device includes a plurality of micro-bumps such that the plurality of micro-bumps are configured as electrical connections to each of the plurality of integrated passive devices to the interposer; and
   dicing the interposer to generate an integrated passive device die such that the integrated passive device die comprises a subset of the plurality of integrated passive devices.

15. The method of claim 14, wherein forming the plurality of integrated passive devices further comprises forming a seal ring around each of the plurality of integrated passive devices.

16. The method of claim 14, further comprising:
   forming a plurality of scribe lines between each of the plurality of integrated passive devices to thereby form a plurality of unit cells separated by scribe lines, wherein each integrated passive device is located in a respective unit cell, and wherein dicing the interposer further comprises dicing the interposer along a subset of the scribe lines to thereby form the integrated passive device die.

17. The method of claim 16, wherein forming the plurality of scribe lines further comprises forming scribe lines in spaces between adjacent seal rings in respective adjacent integrated passive devices.

18. The method of claim 14, further comprising forming the micro-bumps such that at least some of the micro-bumps have a spacing corresponding to a spacing of electrical bonding pads or micro-bumps of an interposer of a chip package structure such that the integrated passive device die is configured to be electrically connected to the interposer by bonding the at least some of the micro-bumps of the integrated passive device die to respective bonding pads of the interposer.

19. The method of claim 14, further comprising forming the micro-bumps to be arranged in an array or a staggered configuration.

20. The method of claim 14, further comprising forming the micro-bumps to have a pitch that is in a range from approximately 20 microns to approximately 100 microns.

* * * * *